US012796030B2

(12) United States Patent
Chang et al.

(10) Patent No.: US 12,796,030 B2
(45) Date of Patent: Nov. 10, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Chia-Hao Chang, Hsinchu City (TW); Jia-Chuan You, Taoyuan City (TW); Yu-Chun Liu, Taipei City (TW); Kuo-Cheng Chiang, Hsinchu County (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 918 days.

(21) Appl. No.: 17/849,739

(22) Filed: Jun. 27, 2022

(65) Prior Publication Data

US 2023/0420509 A1 Dec. 28, 2023

(51) Int. Cl.

| | |
|---|---|
| ***H10D 62/13*** | (2025.01) |
| ***H10D 30/01*** | (2025.01) |
| ***H10D 30/43*** | (2025.01) |
| ***H10D 30/62*** | (2025.01) |
| ***H10D 30/67*** | (2025.01) |

(Continued)

(52) U.S. Cl.

CPC ......... *H10D 62/151* (2025.01); *H10D 30/014* (2025.01); *H10D 30/43* (2025.01); *H10D 30/6211* (2025.01); *H10D 30/6735* (2025.01); *H10D 30/6757* (2025.01); *H10D 62/116* (2025.01); *H10D 62/121* (2025.01); *H10D 64/017* (2025.01); *H10D 84/0128* (2025.01); *H10D 84/0158* (2025.01)

(58) Field of Classification Search

None

See application file for complete search history.

(56) References Cited

U.S. PATENT DOCUMENTS 9,209,247 B2 12/2015 Colinge et al.
9,236,267 B2 1/2016 De et al.

(Continued)

FOREIGN PATENT DOCUMENTS

KR 20210086948 A * 7/2021 ............. H10D 30/62

*Primary Examiner* — Christine S. Kim
*Assistant Examiner* — Tien Tran
(74) *Attorney, Agent, or Firm* — JCIPRNET

(57) ABSTRACT

A semiconductor device includes a substrate, first and second stacks of semiconductor nanosheets, a gate structure, first and second strained layers and a blocking wall. The substrate includes first and second fins separated by an insulating region. The first stack of semiconductor nanosheets is disposed on the first fin. The second stack of semiconductor nanosheets disposed on the second fin. The gate structure wraps the first and second stacks of semiconductor nanosheets. The first strained layer is disposed on the first fin adjacent to the first stack of semiconductor nanosheets. The second strained layer is disposed on the second fin adjacent to the second stack of semiconductor nanosheets. The blocking wall is disposed on the insulating region and located between the first and second strained layers. The top surface of the blocking wall is higher than the top surface of the first strained layer or the second strained layer.

20 Claims, 38 Drawing Sheets

(51) Int. Cl.

| | |
|---|---|
| ***H10D 62/10*** | (2025.01) |
| ***H10D 64/01*** | (2025.01) |
| ***H10D 84/01*** | (2026.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2013/0309837 | A1* | 11/2013 | Chang ................. | H10W 10/012 438/424 |
| 2016/0240652 | A1* | 8/2016 | Ching .................. | H10D 30/014 |
| 2017/0012042 | A1* | 1/2017 | Cai ...................... | H10D 84/834 |
| 2018/0337176 | A1* | 11/2018 | Lee ...................... | H10D 30/024 |
| 2022/0254776 | A1* | 8/2022 | Cheng .................. | H10D 30/014 |
| 2022/0293782 | A1* | 9/2022 | Pan ...................... | H10D 84/013 |

* cited by examiner

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
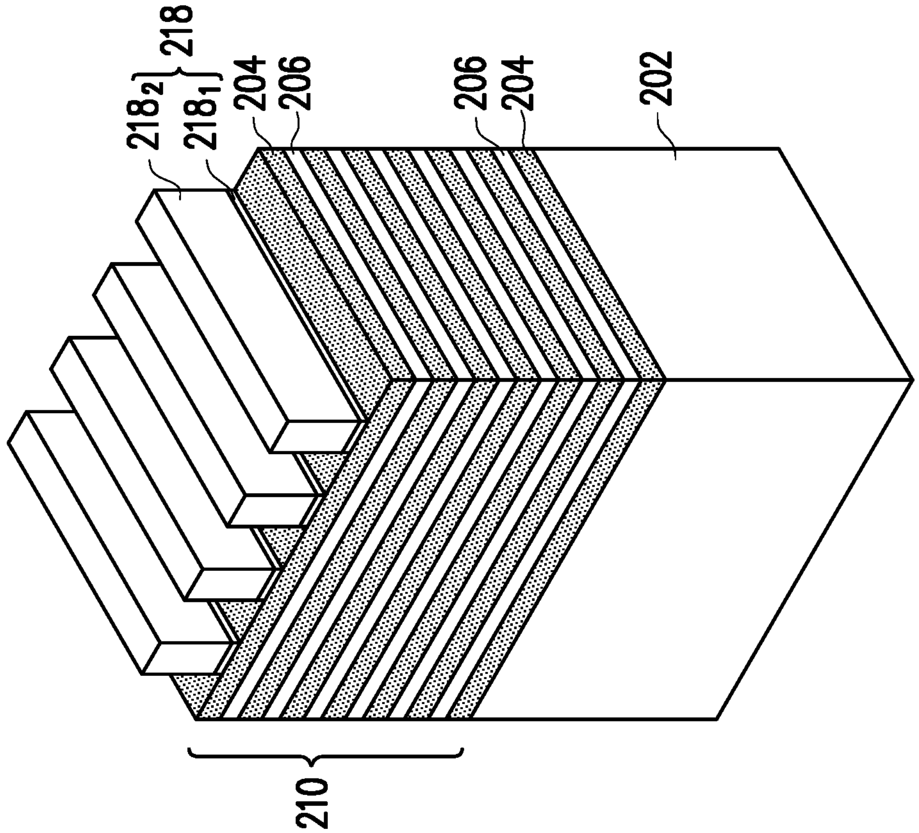
FIGS. 1, 2, 3, 4, 5, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 17C, 18A, 18B and 18C illustrate varying views of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of p-type and/or n-type devices. One of ordinary skill may recognize other embodiments of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 to FIG. 18C illustrate varying views of a method of forming a semiconductor device in accordance with some embodiments. The semiconductor device illustrated in the following embodiments may be, for example but not limited to, a multi-gate device. As used herein, the term "multi-gate device" is used to describe a device (e.g., a semiconductor transistor) that has at least some gate material disposed on multiple sides of at least one channel of the device. In some examples, the multi-gate device may be referred to as a gate-all-around (GAA) device having a gate material disposed on four sides of at least one channel member of the device. The channel member may be referred to as "nanosheet" or "nanowire" which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example but not limited to, a cylindrical in shape or substantially rectangular cross-section. The method is merely an example, and is not intended to limit the present disclosure beyond what is explicitly recited in the claims. Additional steps may be provided before, during, and after method, and some of the steps described can be moved, replaced, or eliminated for additional embodiments of method. Additional features may be added in the semiconductor device depicted in FIG. 1 to FIG. 18C and some of the features described below can be replaced, modified, or eliminated in other embodiments of the semiconductor device.

FIG. 1 to FIG. 5 illustrate perspective views of stages of forming a semiconductor device. Referring to FIG. 1, a substrate 202 is provided. In some embodiments, the substrate 202 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or a combination thereof. The substrate 202 may include various doped regions (e.g., p-type well and/or n-type well) depending on design requirements. In some embodiments, the doped regions may be doped with p-type or n-type dopants. The doped regions may be configured for an n-type device, or alternatively, configured for a p-type device. In some embodiments, an anti-punch-through (APT) implantation is performed on a top portion of the substrate 202 to form an APT region. The conductivity type of the dopants implanted in the APT region is the same as that of the doped regions (or wells). The APT region may extend under the subsequently formed strained layers, and are used to reduce the leakage from the strained layers to the substrate 202. The strained layers are referred to "source/drain regions" in some examples. Source/drain region(s) may refer to a source or a drain, individually or collectively dependent upon the context. For clarity, the doped regions and the APT region are not illustrated in FIG. 1 and subsequent drawings.

In some embodiments, a semiconductor stack 210 is formed over the substrate 202. The semiconductor stack 210 includes first blanket layers 204 and second blanket layers 206 stacked alternately. The first and second blanket layers are referred to as "first and second layers", "first and second materials", "first and second compositions" or "first and second semiconductor materials" in some examples. The first blanket layers 204 and second blanket layers 206 include different materials. In some embodiments, the first blanket layers 204 are SiGe layers having a germanium percentage in the range between about 15 wt % and 40 wt %, and the second blanket layers 206 are Si layers free of germanium. In other embodiments, either of the first blanket layers 204 and second blanket layers 206 may include other materials such as germanium, a compound semiconductor (e.g., silicon carbide, gallium arsenide, gallium phosphide, indium phosphide, indium arsenide, or indium antimonide), an alloy semiconductor (e.g., SiGe, GaAsP, AlInAs, AlGaAs, InGaAs, GaInP, or GaInAsP), the like, or a combination thereof.

The first blanket layers 204 and the second blanket layers 206 have materials with different etching selectivities. In some embodiments, the first blanket layers 204 and the second blanket layers 206 are formed by an epitaxial growth process, such as a molecular beam epitaxy (MBE) process, a metalorganic chemical vapor deposition (MOCVD) process, or the like. In the case, the first blanket layers 204 are epitaxial SiGe layers, and the second blanket layers 206 are epitaxial Si layers. In some embodiments, the first and second blanket layers 204 and 206 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. In other embodiments, the first blanket layers 204 and the second blanket layers 206 are formed by a suitable deposition, such as chemical vapor deposition (CVD), atomic layer deposition (ALD), or the like. In the case, the first blanket layers 204 are poly-SiGe layers, and the second blanket layers 206 are poly-Si layers.

In the illustrated embodiment, the bottom layer and the top layer of the semiconductor stack 210 are SiGe layers. However, the disclosure is not limited thereto. In other embodiments (not shown), the bottom layer of the semiconductor stack 210 is a Si layer and the top layer of the semiconductor stack 210 is a SiGe layer. It is noted that seven layers of first blanket layers 204 and six layers of second blanket layers 206 are illustrated in FIG. 1, which is for illustrative purposes only and not intended to be limiting beyond what is specifically shown in the drawings. Specifically, any number of epitaxial layers may be formed in the semiconductor stack 210; the number of layers depending on the desired number of channel regions for the device 200.

In some embodiments, each of the first blanket layers 204 and the second blanket layers 206 has a thickness ranging from about 5 nm to about 15 nm. As described in more detail below, the second blanket layer 206 may serve as channel region(s) for a subsequently formed multi-gate device and its thickness chosen based on device performance considerations. The first blanket layer 204 may be configured to define a gap between adjacent channel region(s) for a subsequently formed multi-gate device and its thickness chosen based on device performance considerations.

Still referring to FIG. 1, mask strips 218 are formed over the semiconductor stack 210. In some embodiments, a mask layer is formed on the semiconductor stack 210. The mask layer may include a dielectric material, such as silicon oxide, silicon nitride, SiON, SiC, SiCN, SiCON, the like, or a combination thereof. Other materials such as a low-k material may be applicable. The low-k material has a dielectric constant less than 3.9, less than 3, less than 2.5, or even less. In some embodiments, the mask layer includes a first mask layer and a second mask layer over the second mask layer. For example, the first mask layer is a pad oxide layer made of a silicon oxide, which may be formed by a thermal oxidation. The second mask layer is made of a silicon nitride (SiN), which is formed by chemical vapor deposition (CVD), low pressure CVD (LPCVD), plasma enhanced CVD (PECVD), physical vapor deposition (PVD), atomic layer deposition (ALD), or a suitable process. The mask layer is then patterned into the mask strips 218 by using photolithography and etching processes. In some embodiments, each of the mask strips 218 includes a first mask pattern $\mathbf{218}_1$ and a second mask pattern $\mathbf{218}_2$ over the first mask pattern $\mathbf{218}_1$.

Figure 2:
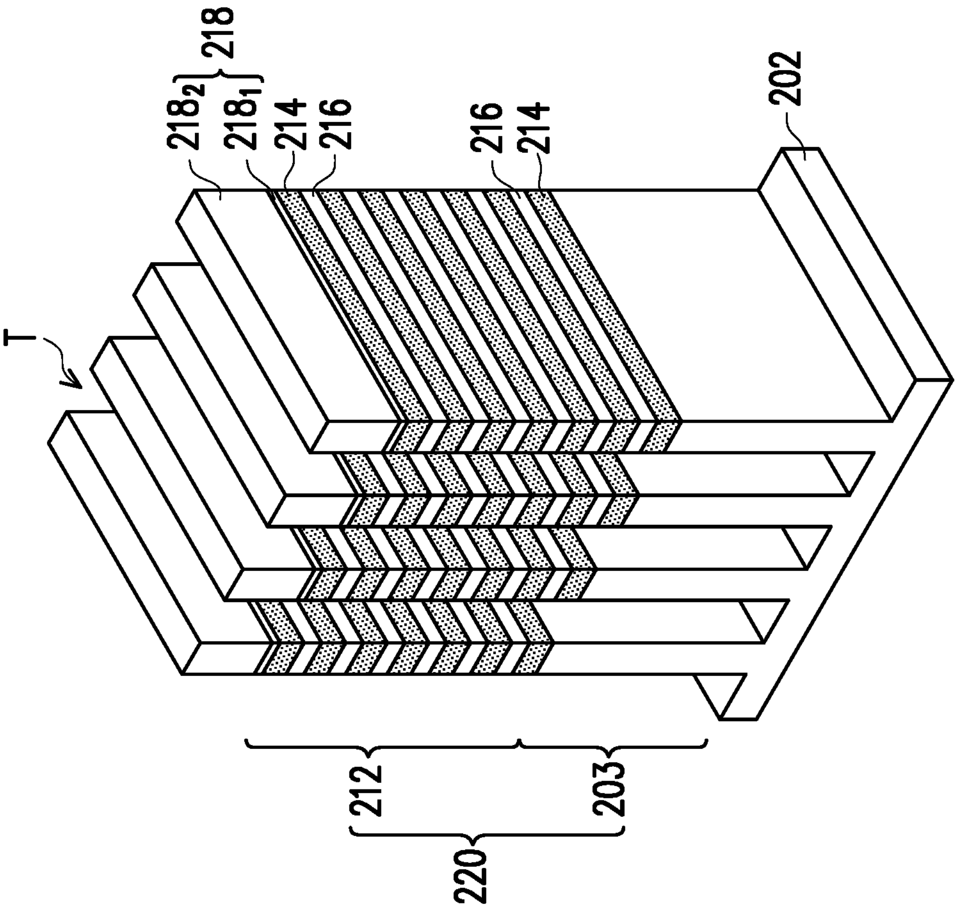

Referring to FIG. 2, the semiconductor stack 210 and the substrate 202 are patterned by using the mask strips 218 as a mask, so as to form semiconductor strips 220 separated by trenches T. The patterning process includes an etching process, such as a dry etching or the like. As shown in FIG. 2, the trenches T extend into the substrate 202, and have lengthwise directions parallel to each other. Herein, the semiconductor strips 212 are referred to as "hybrid fins" in some examples. In some embodiments, each of the semiconductor strips 220 includes a fin 203 protruding from the substrate 202, and a nanosheet stack 212 on the fin 203. In some embodiments, the nanosheet stack 212 includes first nanosheets 214 and second nanosheets 216 stacked alternately. The nanosheets are referred to as "nanowires" or "semiconductor nanosheets" in some examples. In some embodiments, the first nanosheets are referred to as "sacrificial portions", "dummy portions" or "dummy regions" which will be subsequently removed and replaced by a metal gate structure, and the second nanosheets are referred to as "channel members", "channel portions" or "channel regions" which will serve as semiconductor channels. Although only four semiconductor strips 220 are illustrated in FIG. 2, the embodiments of the present disclosure are not limited thereto. In other embodiments, the number of the semiconductor strips 220 may be adjusted as needed. The adjacent semiconductor strips 220 may have the same width or different widths.

Figure 3:
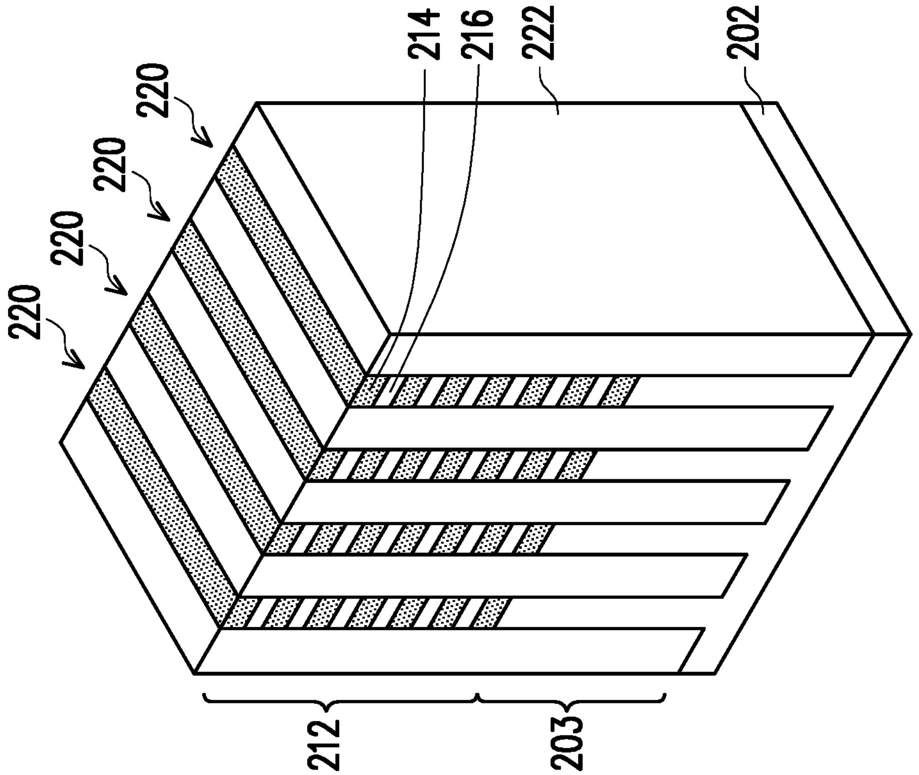
Figure 4:
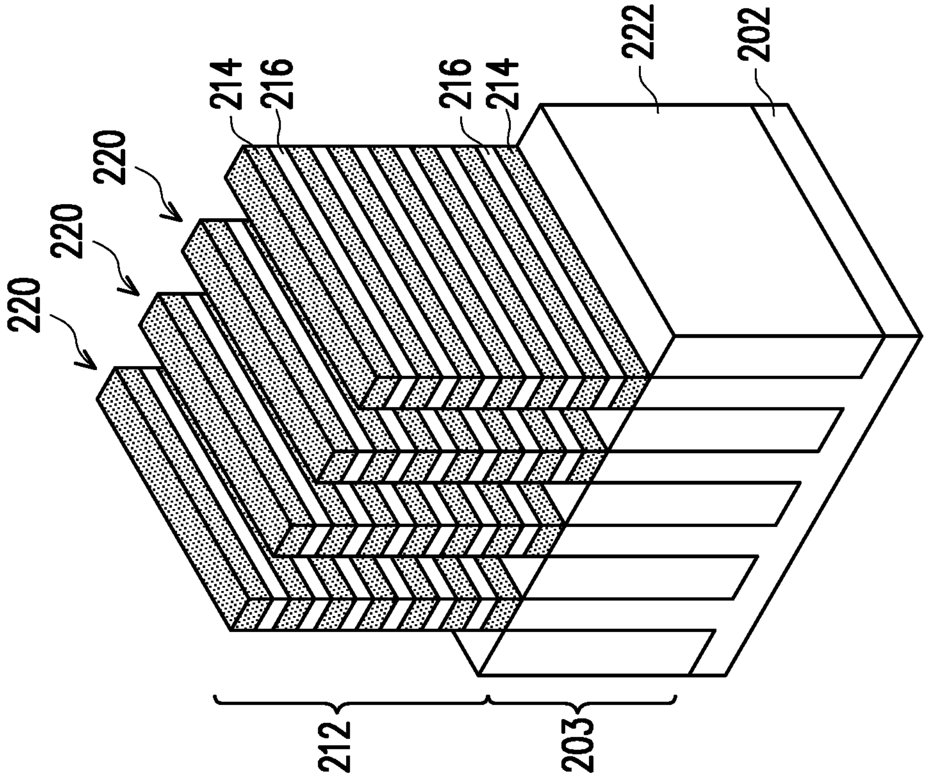

Referring to FIG. 3 and FIG. 4, insulating regions 222 are formed in the trenches T between the semiconductor strips 220. In some embodiments, an insulating material is formed on the substrate 202, covering the semiconductor strips 220 and filling up the trenches T. In addition to the semiconductor strips 220, the insulating material further covers the mask strips 218. The insulating material may include silicon oxide, silicon nitride, silicon oxynitride, a spin-on dielectric material, or a low-k material. The low-k material has a dielectric constant less than 3.9, less than 3, less than 2.5, or even less. The insulating material may be formed by flowable chemical vapor deposition (FCVD), high-density-plasma chemical vapor deposition (HDP-CVD), sub-atmospheric CVD (SACVD), or spin-on process. A planarization process may be performed to remove a portion of the insulating material and the mask strips 218, until the semiconductor strips 220 are exposed. In the case, as shown in FIG. 3, the top surfaces of the semiconductor strips 220 are substantially coplanar with the top surfaces of the insulating regions 222. In some embodiments, the planarization process includes a chemical mechanical polish (CMP), an etching back process, the like, or a combination thereof.

Referring to FIG. 3 and FIG. 4, the insulating regions 222 are recessed, until the semiconductor strips 220 protrude from top surfaces of the remaining insulating regions 222. Specifically, after the recessing operation, the top surfaces of the insulating regions 222 are lower than the top surfaces of the semiconductor strips 220 and the nanosheet stacks 212 are exposed by the insulating regions 222. The top surfaces of the insulating regions 222 may be substantially coplanar with or lower than bottom surfaces of the nanosheet stacks 212. Further, the top surfaces of the insulating regions 222 may have a flat surface, a convex surface, a concave surface (such as dishing), or a combination thereof. In some embodiments, the insulating regions 222 are recessed by using an appropriate etching process, such as a wet etching process with hydrofluoric acid (HF), a dry etching process, or a combination thereof. In some embodiments, a height difference between the top surfaces of the semiconductor strips 220 and the top surfaces of the insulating regions 222 ranges from about 30 nm to about 100 nm. The insulating regions 222 are referred to as "isolation strips", "shallow trench isolation (STI) regions" or "deep trench isolation (DTI) regions" in some examples.

Figure 5:
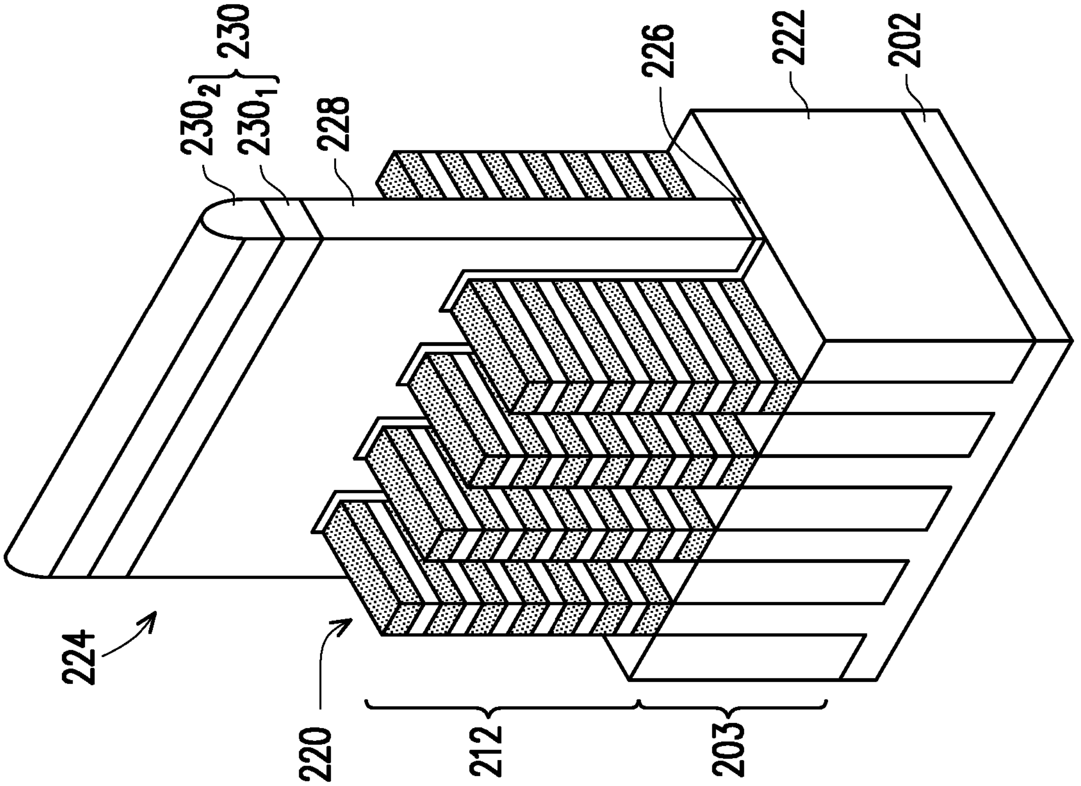
Figure 6A:
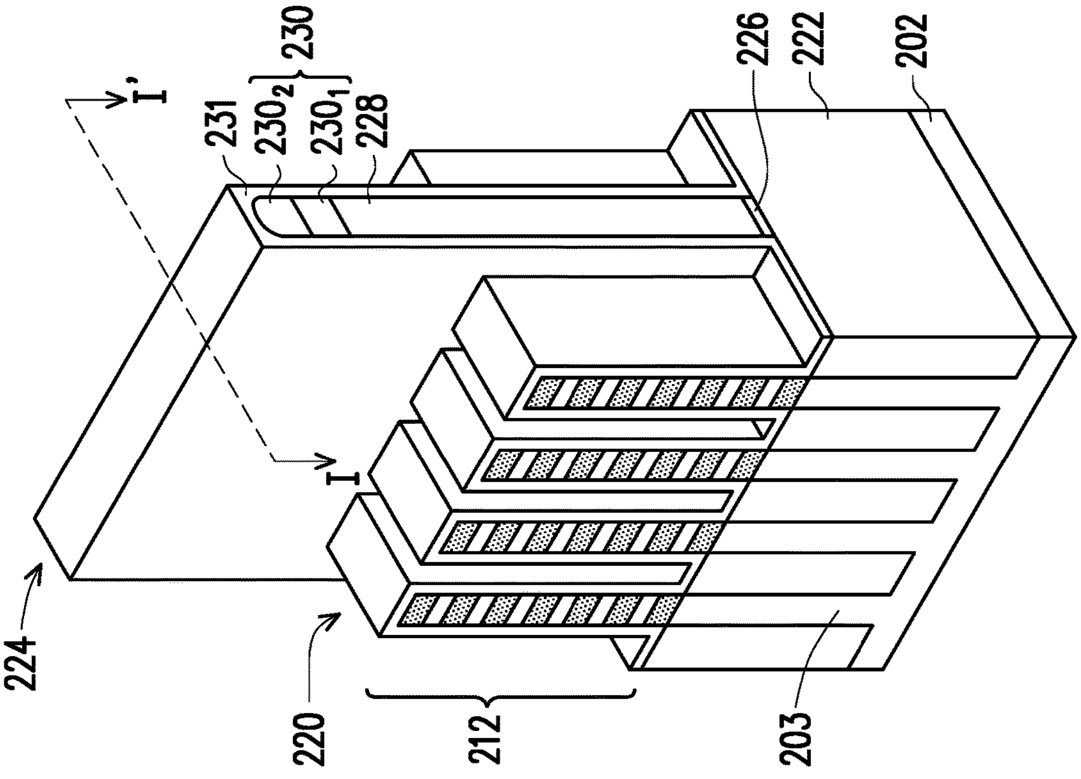
Figure 6B:
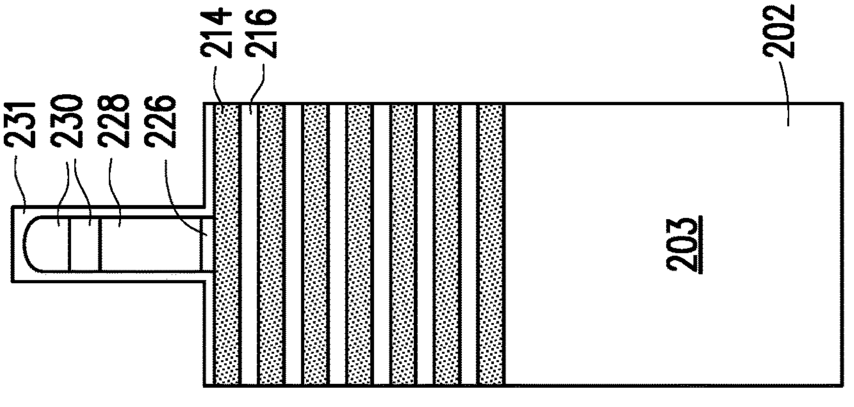

Referring to FIG. 5, at least one dummy gate stack 224 is formed across portions of the nanosheet stacks 212 and portions of the insulating regions 222. The dummy gate stack 224 may extend along a direction different from (e.g., perpendicular to) the extending direction of the nanosheet stacks 212. The dummy gate stack 224 defines the channel regions of the GAA device. The dummy gate stack 224 includes a dummy gate dielectric layer 226 and a dummy gate electrode layer 228 over the dummy gate dielectric layer 226. In some embodiments, a dummy gate dielectric material and a dummy gate electrode material are blanket-formed over the semiconductor strips 220. The dummy gate dielectric material and the dummy gate electrode material are deposited using CVD, LPCVD, PECVD, PVD, ALD, or a suitable process. A mask layer 230 is formed over the dummy gate electrode material. The mask layer 230 may include a dielectric material, such as silicon oxide, silicon nitride, SiON, SiC, SiCN, SiCON, the like, or a combination thereof. Other materials such as a low-k material may be applicable. The low-k material has a dielectric constant less than 3.9, less than 3, less than 2.5, or even less. In some embodiments, the mask layer 230 includes a first mask layer $\mathbf{230_1}$ (e.g., silicon oxide layer) and a second mask layer $\mathbf{230_2}$ (e.g., silicon nitride layer) over the first mask layer $\mathbf{230_1}$. Thereafter, the dummy gate dielectric material and dummy gate electrode material are patterned into the dummy gate stack 224 by using the mask layer 230 as a mask. The mask layer 230 is regarded as part of the dummy gate stack 224 in some examples.

FIG. 6A to FIG. 18A illustrate perspective views of stages of forming the semiconductor device 200. FIG. 6B to FIG. 18B illustrate cross-sectional views taken along lines I-I' of FIG. 6A to FIG. 18A. FIG. 17C and FIG. 18C illustrate cross-sectional views taken along line III-III' of FIG. 17A and FIG. 18A.

Referring to FIG. 6A, FIG. 6B, FIG. 7A and FIG. 7B, spacers 232 are formed on sidewalls of the dummy gate stack 224 and sidewalls of the nanosheet stacks 212 by depositing a spacer material 231 and followed by an anisotropic etching. In some embodiments, the spacers 232 include a dielectric material, such as silicon oxide, silicon nitride, SiON, SiC, SiCN, SiCON, or a combination thereof. Other materials such as a low-k material may be applicable. The low-k material has a dielectric constant less than 3.9, less than 3, less than 2.5, or even less. Although the spacers 232 illustrated in FIG. 7A and FIG. 7B have a single-layer structure, the embodiments of the present disclosure are not limited thereto. In other embodiments, the spacers 232 may have a multi-layer structure. For example, the spacers 232 may include a silicon oxide layer and a silicon nitride layer on the silicon oxide layer.

Figure 7B:
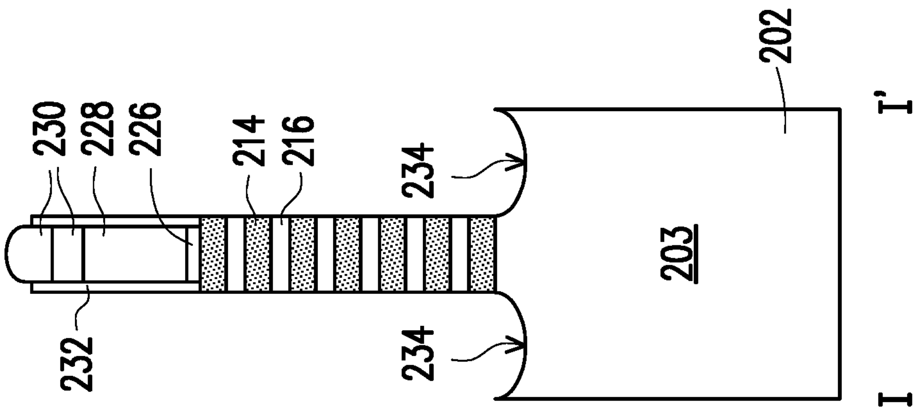
Figure 7A:
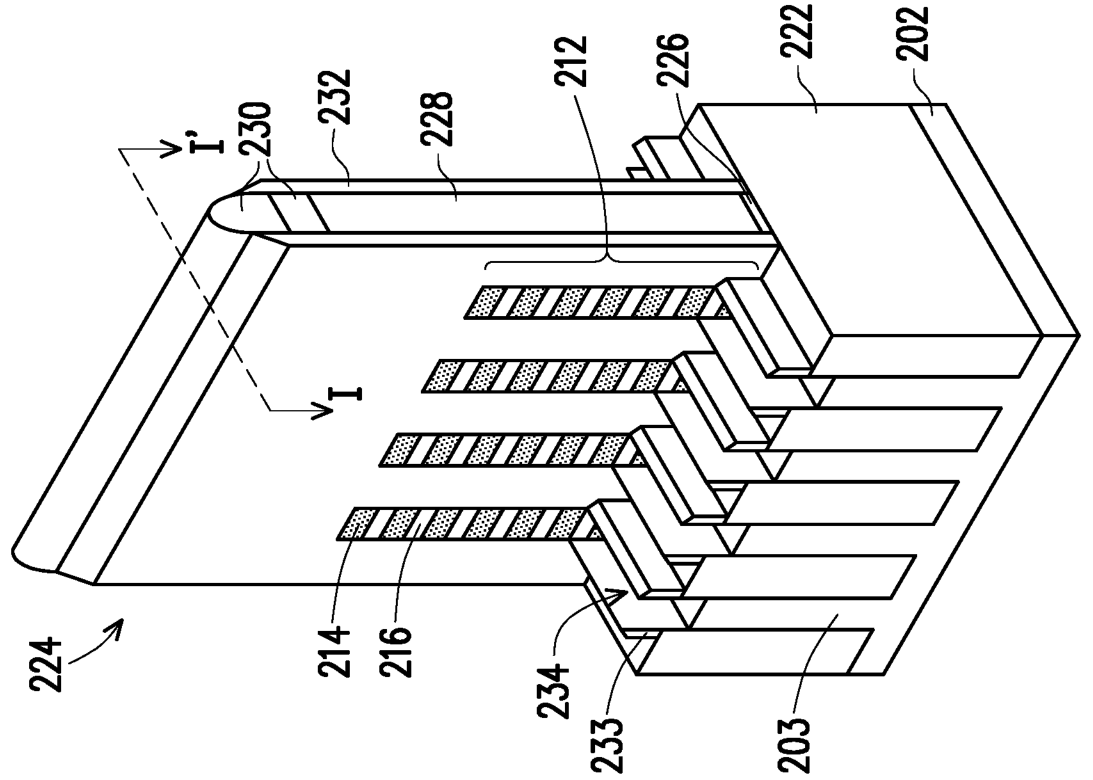
Figure 8B:
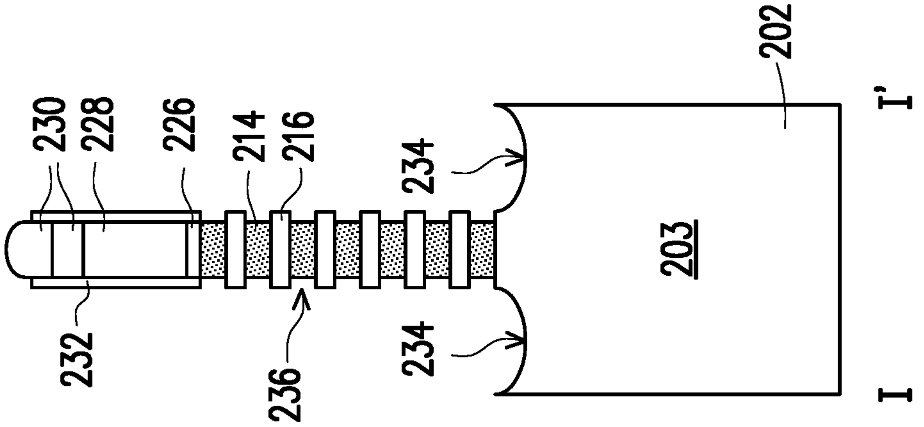
Figure 8A:
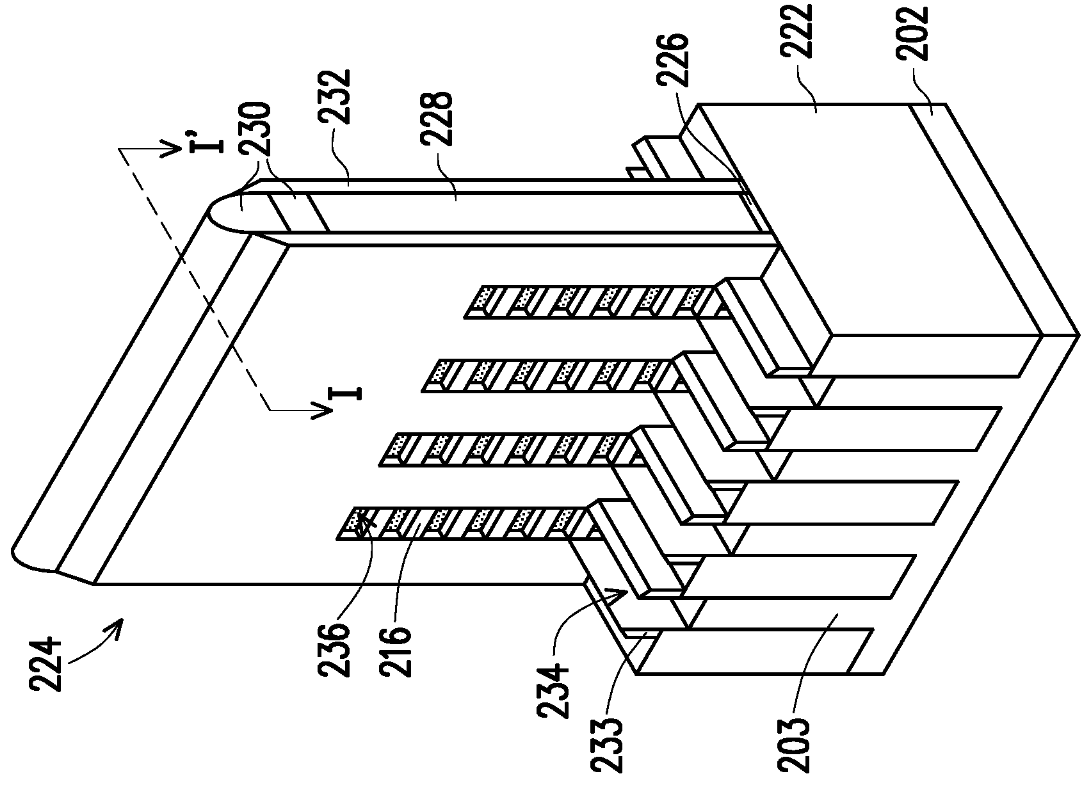

Upon the spacer forming operation, the dummy gate stack 224 and the spacers 232 cover middle portions of the nanosheet stacks 212, and reveal the opposite end portions of the nanosheet stacks 212. As shown in FIG. 8A and FIG. 8B, the end portions of the nanosheet stacks 212 are removed and the underlying fins 203 are recessed to form recesses 234. In other words, the end portions of the nanosheet stacks 212 are entirely removed and portions of the fins 203 are further removed. The recesses 234 are referred to as "source/drain (S/D) recesses" in some examples. In some embodiments, the end portions of the nanosheet stacks 212 may be removed by an anisotropic etching process, an isotropic etching process, or a combination thereof. In some embodiments, the top surfaces of the recesses 234 are lower than the top surfaces of the insulating regions 222. In some embodiments, the spacers 232 on the nanosheet stacks 212 are partially removed during the recess forming operation, and the remaining spacers 233 are left standing over and aligned to the edges of insulating regions 222, with the recesses 234 formed therebetween, as shown in FIG. 7A. In many embodiments, the method of forming the recesses 234 includes performing a suitable etching process, such as a dry etching process, a wet etching process, or an RIE process.

Referring to FIG. 8A and FIG. 8B, portions of the first nanosheets 214 are laterally recessed. In some embodiments, the portions of the first nanosheets 214 exposed by the recesses 234 are removed, and thus, cavities 236 are respectively formed between the second nanosheets 216. In some embodiments, the first nanosheets 214 are laterally recessed by a wet etching, a dry etching, or a combination thereof. For example, the first nanosheets 214 may be selectively etched by using a wet etchant including, for example but not limited to, ammonium hydroxide ($NH_4OH$), tetramethylammonium hydroxide (TMAH), ethylenediamine pyrocatechol (EDP), or potassium hydroxide (KOH) solutions. In other embodiments, before laterally recessing the portions of the first nanosheets 214, the end portions of the first nanosheets 214 exposed by the recesses 234 may be selectively oxidized, so as to increase the etching selectivity between the first and second nanosheets 214 and 216. In other embodiments, the oxidation process may be performed by exposing to a wet oxidation process, a dry oxidation process, or a combination thereof. The chemical used in the oxidation process may include $H_2SO_4$ or the like.

Referring to FIG. 8A, FIG. 8B, FIG. 9A and FIG. 9B, inner spacers 238 are formed in the cavities 236. In some embodiments, an inner spacer material is formed on the substrate 202. In some embodiments, the inner spacer material conformally covers the recesses 234 and the spacers 232 on the dummy gate stack 224, and further fills in the cavities 236 to reduce the size of the cavities 236 or completely fill in the cavities 236. In some embodiments, the inner spacer material includes silicon oxide, silicon nitride, silicon carbide, silicon carbide nitride, silicon oxide carbide, silicon carbide oxynitride, and/or other suitable dielectric materials, and may be formed by ALD or a suitable method. In other embodiments, the inner spacer material includes a low-k material having a dielectric constant less than 3.9, less than 3, less than 2.5, or even less. Thereafter, the inner spacer material is partially removed to form inner spacers 238 in the cavities 236. In some embodiments, the inner spacer material layer is partially removed by a plasma dry etching or a suitable method. Generally, the plasma dry etching etches a layer in wide and flat areas faster than a layer in concave (e.g., holes, grooves and/or slits) portions. Thus, the remaining inner spacer material forms the inner spacers 238 inside the cavities 236.

Figure 10A:
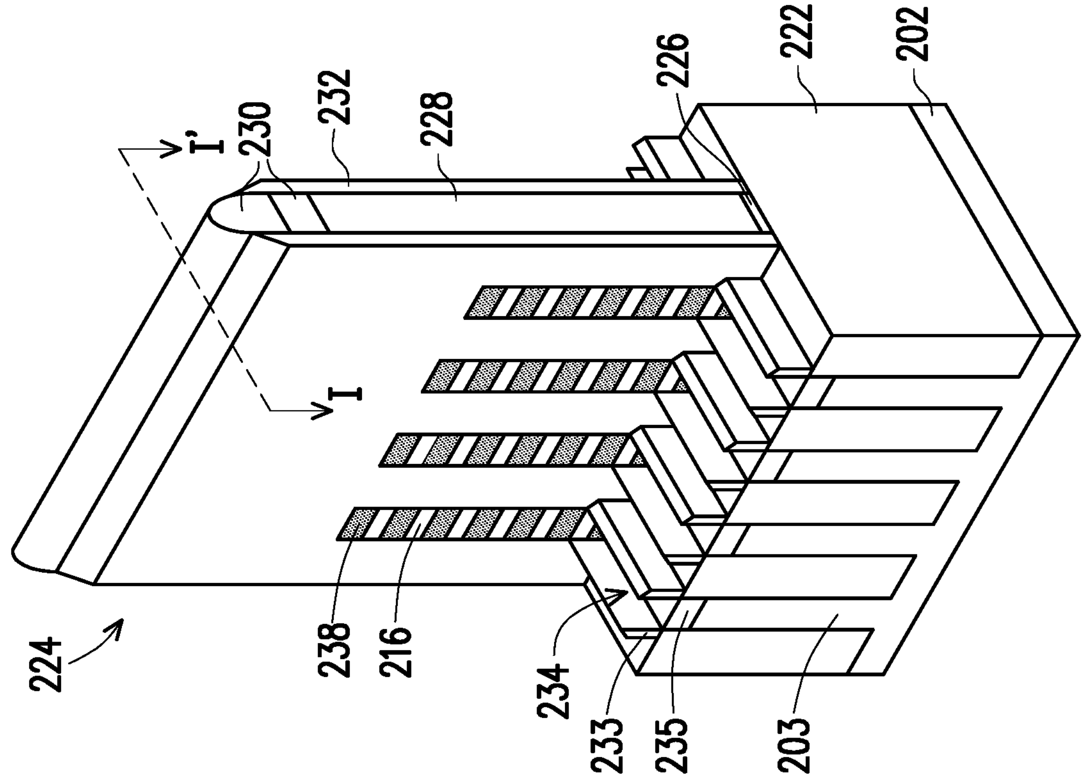
Figure 10B:
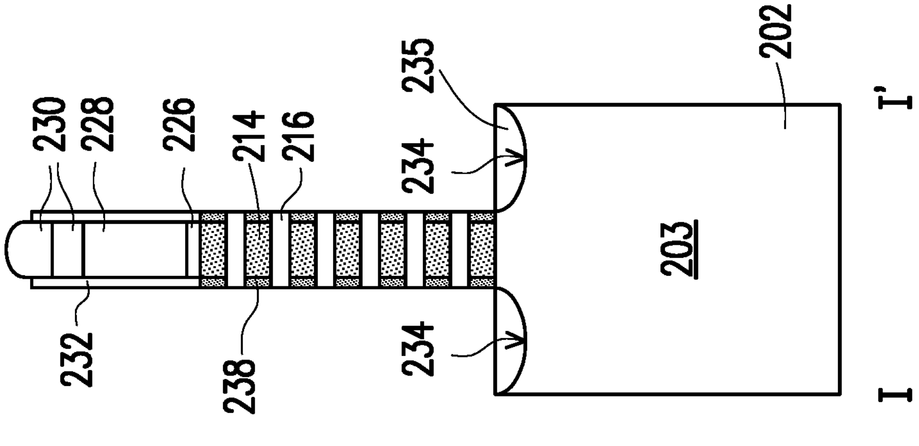

Referring to FIG. 10A and FIG. 10B, a liner layer 235 is formed in bottoms of the recesses 234. In some embodiments, the liner layer 235 includes Si, Ge, SiGe, the like, or a combination thereof. In some embodiments, the liner layer 235 is formed by an epitaxial growth process and is grown from the bottoms of the recesses 234. However, the disclosure is not limited thereto. In other embodiments, the liner layer 235 is formed by ALD and is formed in the bottoms of the recesses 234 and covers the inner spacers 238 and the second nanosheets 216.

Figure 11A:
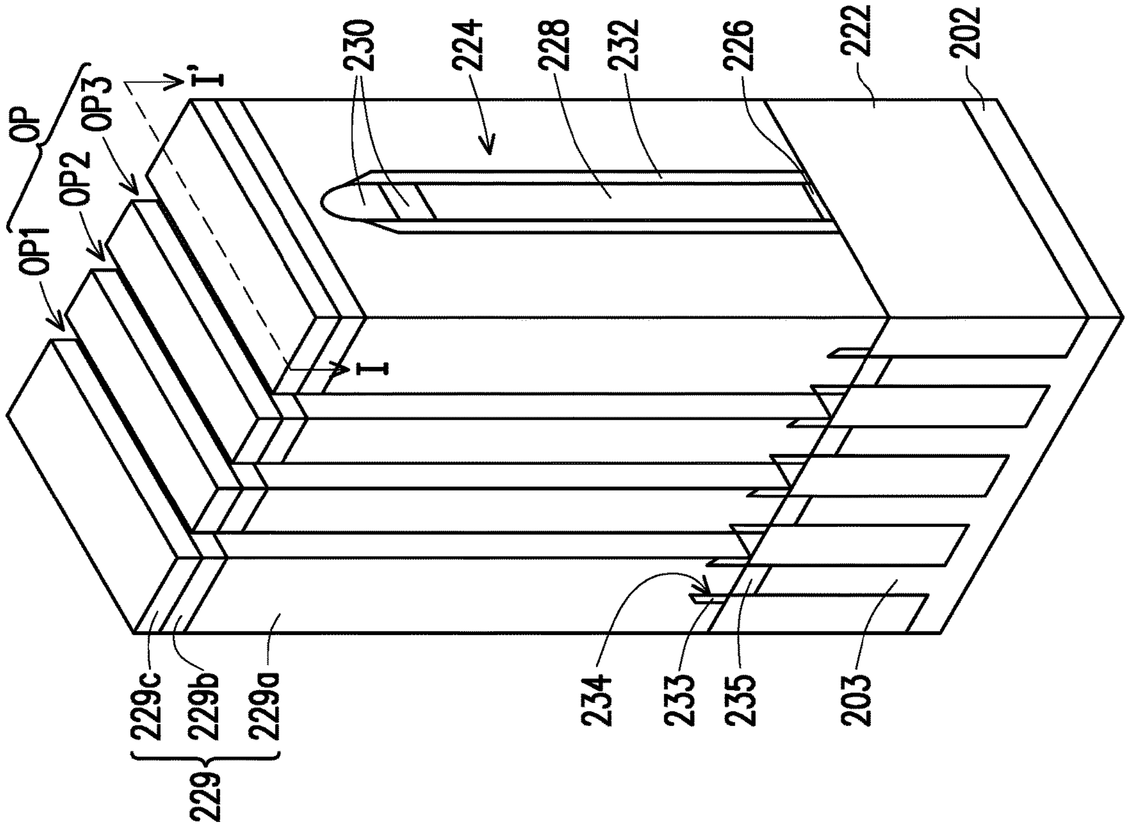
Figure 11B:
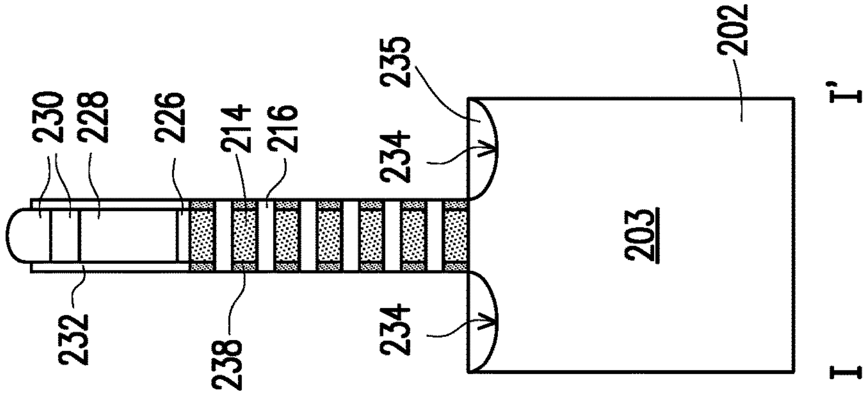

Referring to FIG. 11A and FIG. 11B, a hard mask layer 229 with openings OP1-OP3 is formed over the substrate 202. In some embodiments, the openings OP1-OP3 of the hard mask layer 229 are formed across the dummy gate stack 224 and expose portions of the insulating regions 222. Specifically, one of the openings OP1-OP3 of the hard mask layer 229 is formed on the corresponding insulating region 222 between two adjacent recesses 234. Each of the opening has an inverted-U shape in a certain cross-section. The hard mask layer 229 may include a dielectric material, such as silicon oxide, silicon nitride, SiON, SiC, SiCN, SiCON, the like, or a combination thereof. Other materials such as a low-k material or a photoresist material may be applicable. The low-k material has a dielectric constant less than 3.9, less than 3, less than 2.5, or even less. In some embodiments, the hard mask layer 229 includes, from bottom to top, a first hard mask layer 229_a_, a second hard mask layer 229_b_ and a third mask hard mask layer 229_c_. For example, the first hard mask layer 229_a_ includes silicon oxide, the second hard mask layer 229_b_ includes silicon nitride, and the third mask hard mask layer 229_c_ includes a photoresist material. The hard mask layer 229 is formed using CVD, LPCVD, PECVD, PVD, ALD, spin-coating, or a suitable process, followed by photolithography and etching processes.

Figure 12B:
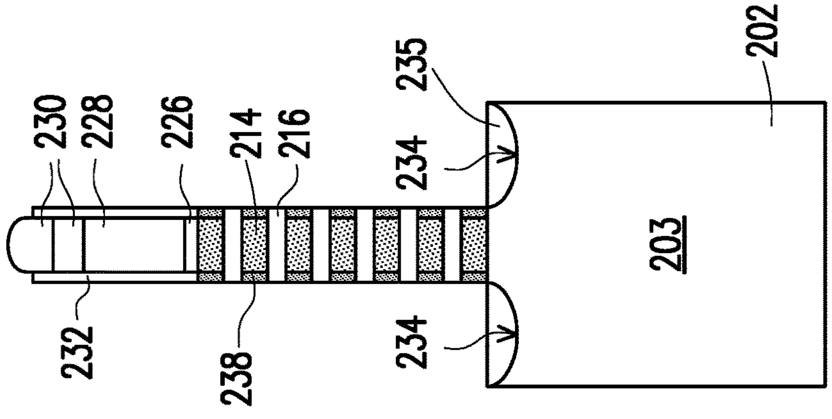
Figure 12A:
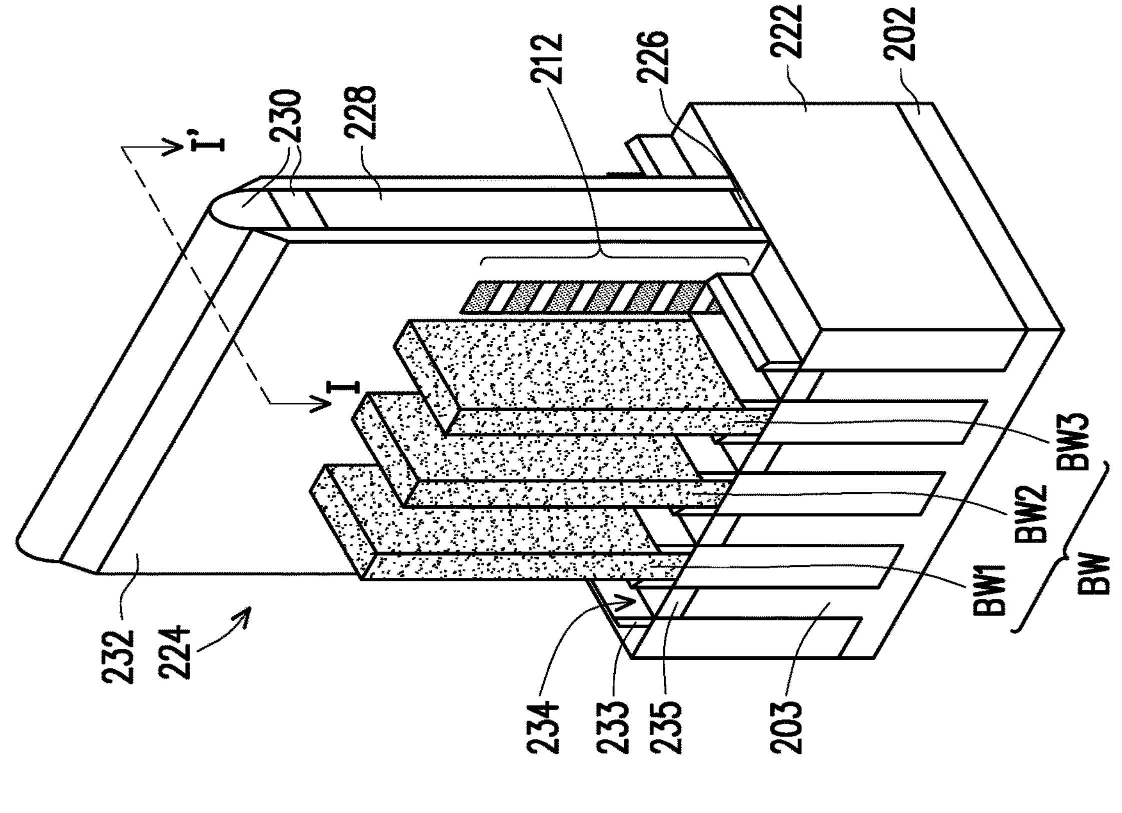

Referring to FIG. 12A and FIG. 12B, blocking walls BW1-BW3 (collectively referred to as "blocking walls BW") are formed in the openings OP1-OP3. In some embodiments, a blocking wall material is formed over the hard mask layer 229 and fills in the openings OP1-OP3. The blocking wall material and the hard mask layer 229 have materials with different etching selectivities. The blocking wall material may include a material having an etching selectivity different from that of the hard mask layer 229. In some embodiments, the blocking wall material may include a dielectric material, such as silicon oxide, silicon nitride, SiON, SiC, SiCN, SiCON, the like, or a combination thereof. Other materials such as a metal-containing insulating material may be applicable. The metal-containing insulating material includes $Al_2O_3$ or $AlSiO_x$, or the like. Thereafter, an etching back process is performed to the blocking wall material. In some embodiments, the remaining blocking material forms the blocking walls BW1-BW3. Specifically, one of the blocking walls BW1-BW3 is between two adjacent spacers 233 or two adjacent recesses 234. The hard mask layer 229 is then removed by a suitable etching process.

Figure 13B:
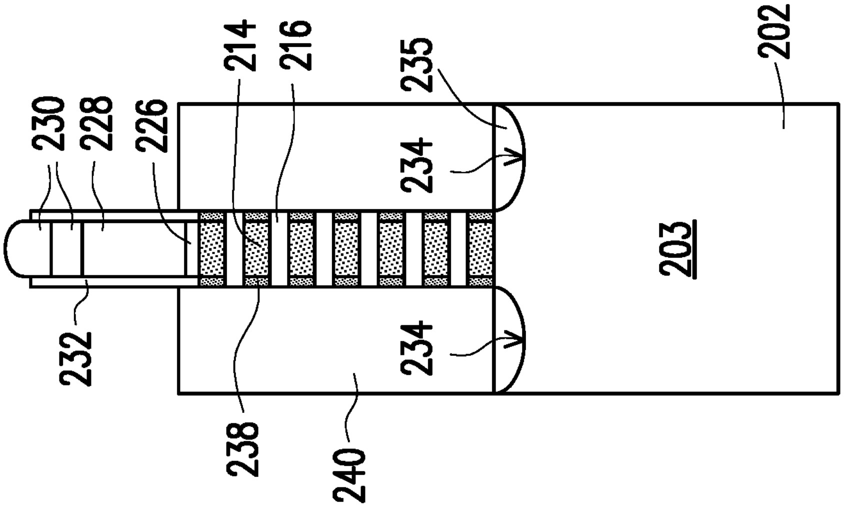
Figure 13A:
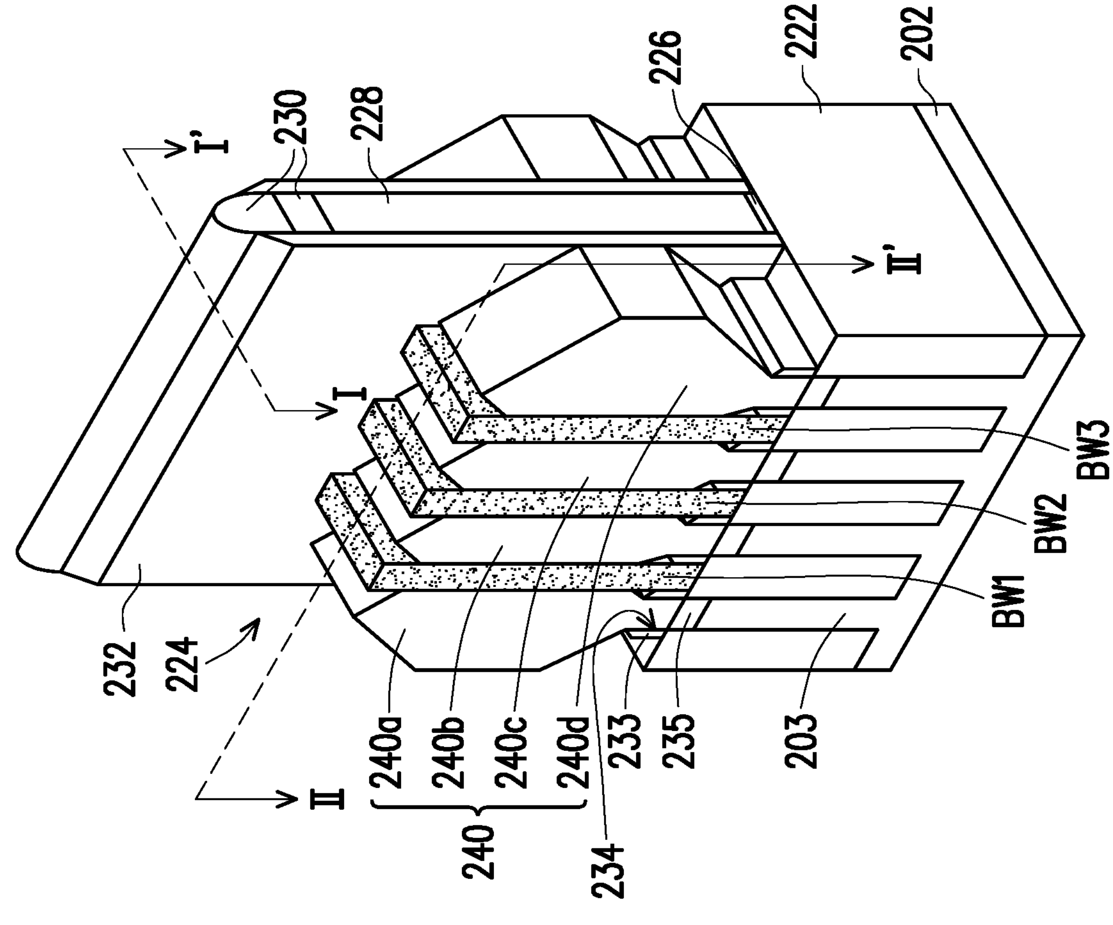

Referring to FIG. 13A and FIG. 13B, strained layers 240_a_-240_d_ (collectively referred to as "strained layers 240") are epitaxially grown from the liner layer 235. In some embodiments, the strained layers 240 are used to strain or stress the second nanosheets (which may be referred to as channel members) 216 and the fins 203. Herein, the strained layers may be referred to as "epitaxial layers", "S/D regions" or "highly doped low resistance materials" in some examples. In some embodiments, the strained layers 240 include source regions disposed at one side of the dummy gate stack 224 and drain regions disposed at another side of the dummy gate stack 224. The source regions cover ends of the fins 203, and the drain regions cover opposite ends of the fins 203. The strained layers 240 are abutted and electrically connected to the second nanosheets 216, while the strained layers 240 are electrically isolated from the first nanosheets 214 by the inner spacers 238. In some embodiments, as shown in FIG. 13A and FIG. 13B, the strained layers 240 extend beyond the top surfaces of the nanosheet stacks 212. However, the embodiments of the present disclosure are not limited thereto, in other embodiments, the top surfaces of the strained layers 240 are substantially flushed with the top surfaces of the nanosheet stacks 212.

In some embodiments, the strained layers 240 are grown from the material of the liner layer 235. For example, when the liner layer 235 is polysilicon layer, the strained layers may be a silicon-containing material. In some embodiments, the liner layer 235 is beneficial for forming the strained layers 240 in the recesses 234 because the liner layer 235 improves a good interface for epitaxially growing the strained layers 240.

In some other embodiments, the strained layers 240 include a suitable material, for a p-type device. For example, if the liner layer 235 is silicon, the strained layers 240 may include SiGe, SiGeB, Ge, GeSn, or the like. In other embodiments, the strained layers 240 includes a suitable material for an n-type device. For example, if the liner layer 235 is silicon, the strained layers 240 may include silicon, SiC, SiCP, SiP, or the like. In some embodiments, the strained layers 240 are formed by MOCVD, MBE, ALD, or the like.

In some embodiments, the strained layers 240 may be doped with a conductive dopant. For example, the strained layers 240 may be epitaxial-grown with a p-type dopant for straining a p-type device. That is, the strained layers 240 is doped with the p-type dopant to be the source and the drain of the p-type device. The p-type dopant includes boron or $BF_2$, and the strained layers 240 may be epitaxial-grown by LPCVD process with in-situ doping. In other embodiments, the strained layers 240 is epitaxial-grown with an n-type dopant for straining an n-type device. That is, the strained layers 240 is doped with the n-type dopant to be the source and the drain of the n-type device. The n-type dopant includes arsenic and/or phosphorus, and the strained layers 240 may be epitaxial-grown by LPCVD process with in-situ doping.

In some embodiments, the strained layers 240*a*-240*d* include the same material and are formed simultaneously. For example, the strained layers 240*a*-240*d* are doped SiGe layers. For example, the strained layers 240*a*-240*d* are doped SiC layers. In other embodiments, the strained layers 240*a*-240*b* include different materials and are formed separately. For example, the strained layers 240*a*-240*b* are doped SiGe layers, and the strained layers 240*c*-240*d* are doped SiC layers. For example, the strained layers 240*a*-240*b* are doped SiC layers, and the strained layers 240*c*-240*d* are doped SiGe layers In some embodiments, as shown in FIG. 13A, adjacent strained layers 240 are separated from each other by one blocking wall BW therebetween. Specifically, the strained layers 240*a* and 240*b* are separated by the blocking wall BW1, the strained layers 240*b* and 240*c* are separated by the blocking wall BW2, and the strained layers 240*c* and 240*d* are separated by the blocking wall BW3. In some embodiments, as a result of the epitaxial-grown process used to form the strained layers 240, the cross-sectional views of the strained layers 240 may have a diamond-like shape or a polygonal shape (e.g., a pentagonal shape, a hexagonal shape, etc.), and portions of the sidewalls of the strained layers are conformal to and in contact with the blocking walls BW. In some embodiments, after forming the strained layers 240, the blocking walls BW may be removed as needed. The configurations in cross-section views of the strained layers and blocking layers are described in details below taken along the line II-II' (see FIG. 13A) in FIG. 19 to FIG. 33.

Figure 14B:
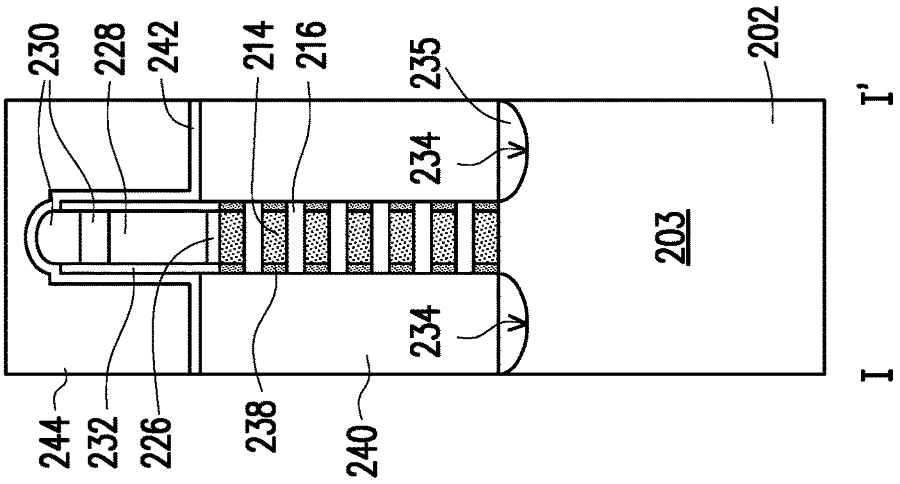
Figure 14A:
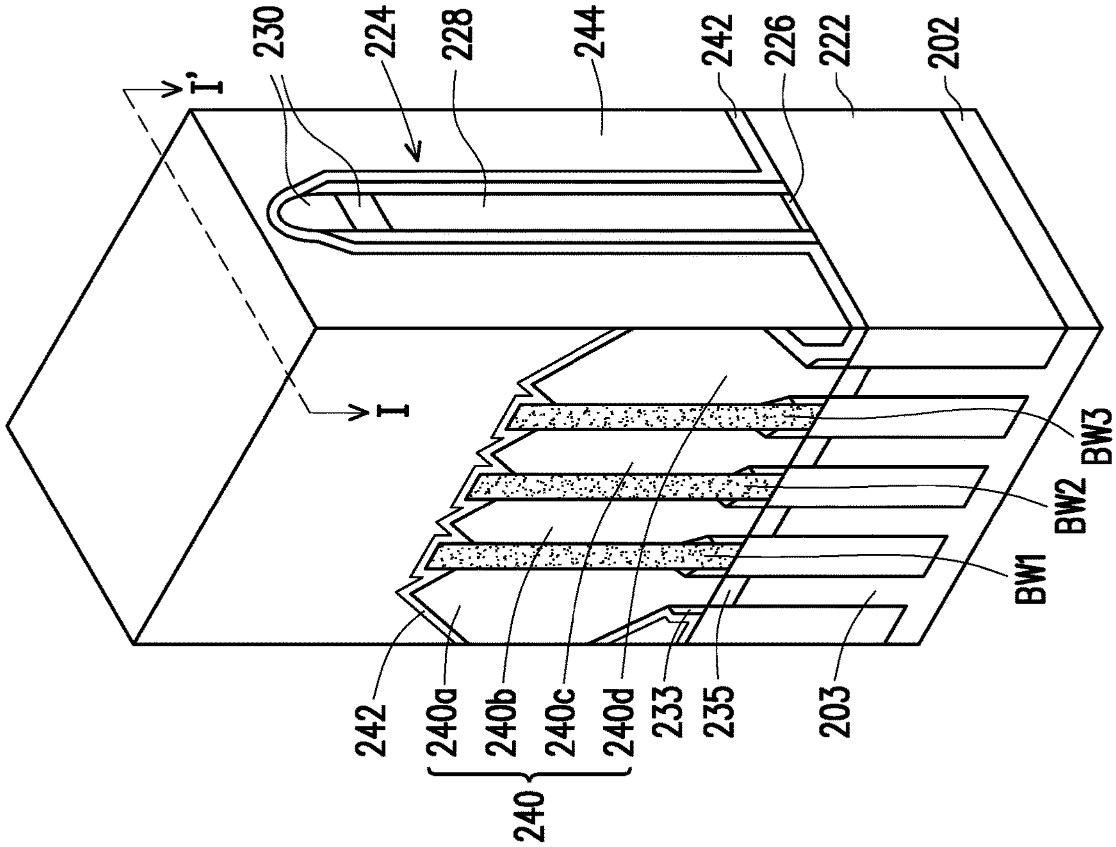

Referring to FIG. 14A and FIG. 14B, a contact etch stop layer (CESL) 242 is formed over the strained layers 240 and the blocking walls BW. In some embodiments, the CESL 242 conformally covers the upper portions of the strained layers 240, the upper portions of the blocking walls BW, and the sidewalls of the spacers 232 and 233. The CESL 242 may include silicon nitride, silicon oxynitride, silicon nitride with oxygen (O) or carbon (C) elements, metal oxide such as $Al_2O_3$, the like, or a combination thereof, and may be formed by CVD, PVD, ALD, or a suitable process.

Thereafter, an interlayer dielectric (ILD) layer 244 is formed over the CESL 242. In some embodiments, the ILD layer 244 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, the like, or a combination thereof. In some other embodiments, the ILD layer 244 includes a low-k material. The low-k material has a dielectric constant less than 3.9, less than 3, less than 2.5, or even less. Examples of the low-k material include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), the like, or a combination thereof. In other embodiments, the ILD layer 244 may have a single-layer structure or a multi-layer structure. In some embodiments, the ILD layer 244 is formed by FCVD, CVD, HDPCVD, SACVD, spin-on process, sputtering, or a suitable process.

Figure 15B:
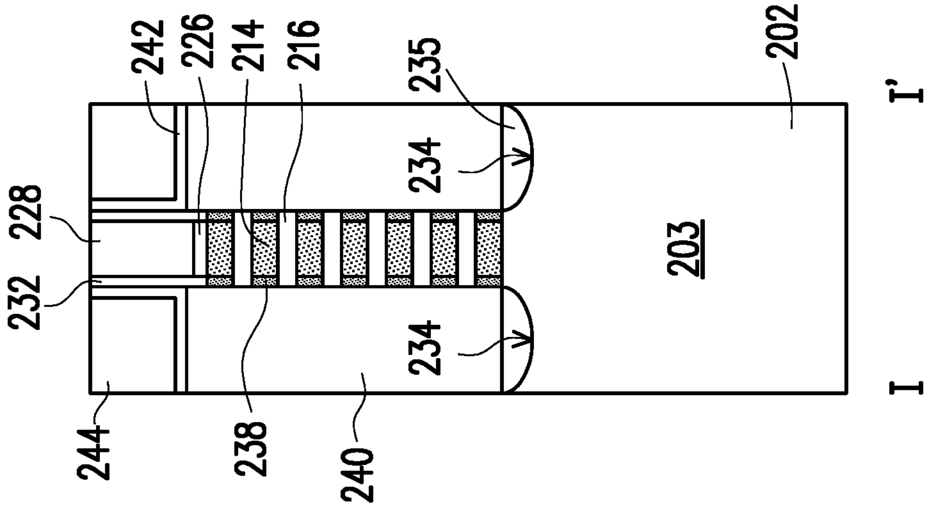
Figure 15A:
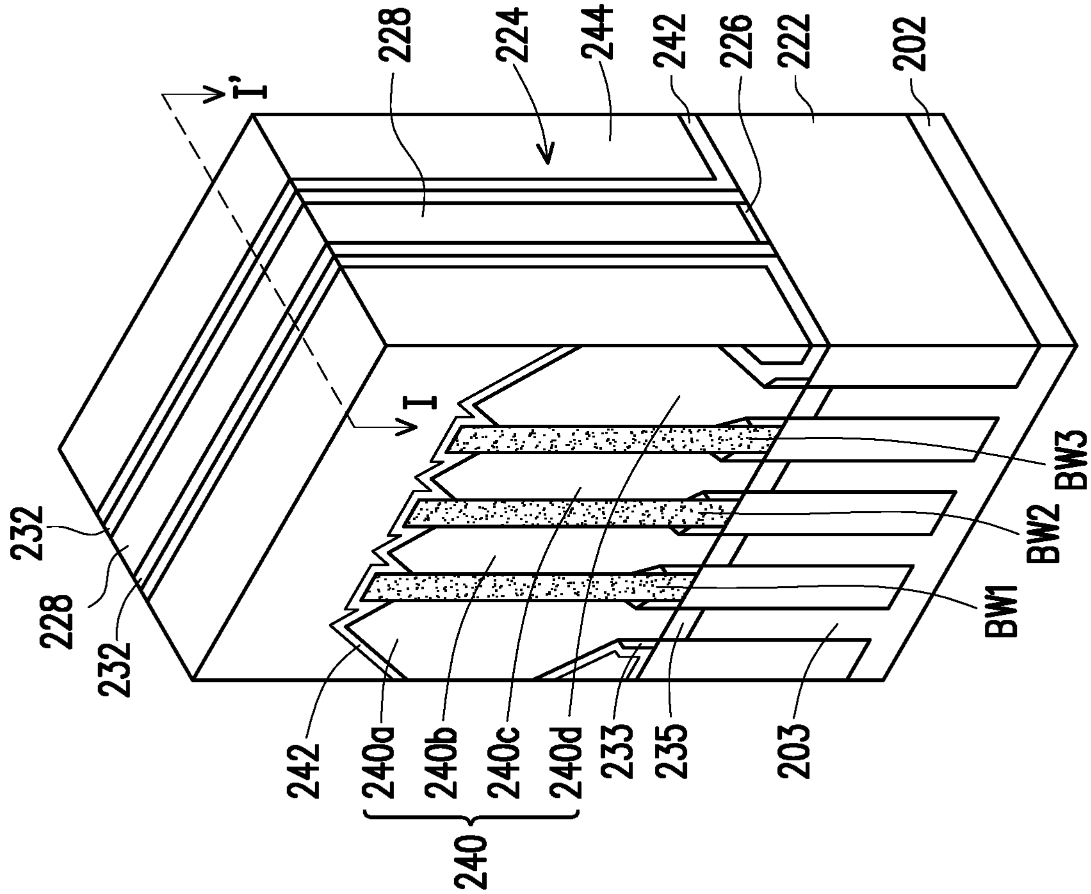

Referring to FIG. 15A and FIG. 15B, a planarization process such as CMP is performed to planarize the topography of the structure. In some embodiments, the ILD layer 244, the CESL layer 242, the spacers 232 are partially removed and the mask layer 230 is entirely removed, until the top surface of the dummy gate electrode layer 228 is exposed. In some embodiments, the top surface of the dummy gate electrode layer 228 is substantially flushed with the top surfaces of the ILD layer 244, the CESL layer 242 and the spacers 232.

Figure 16A:
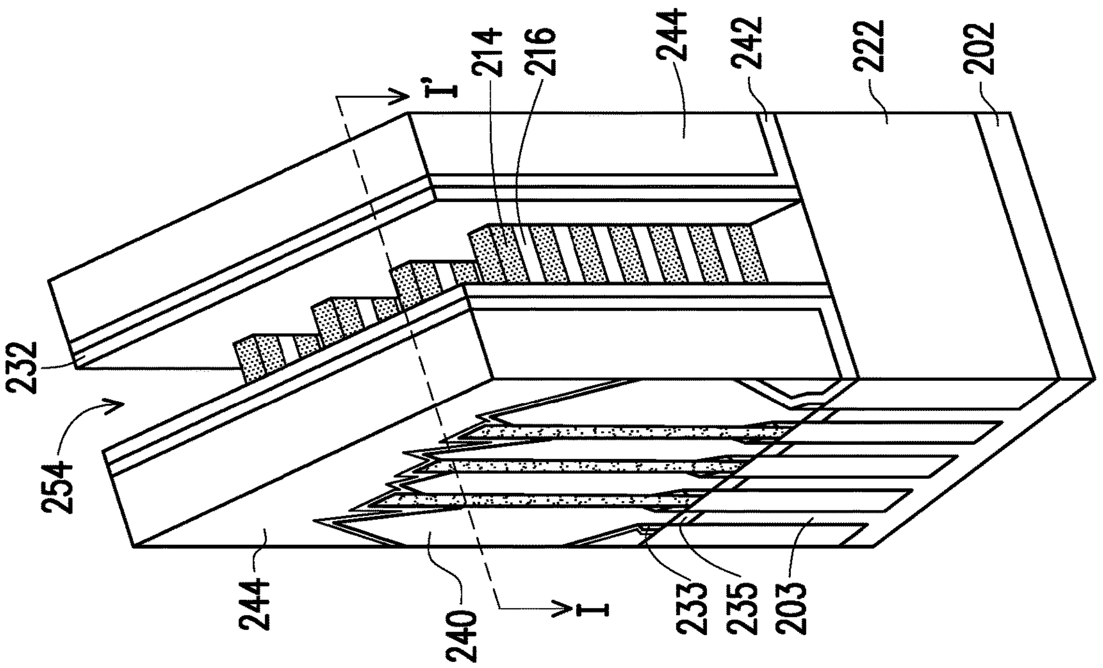
Figure 16B:
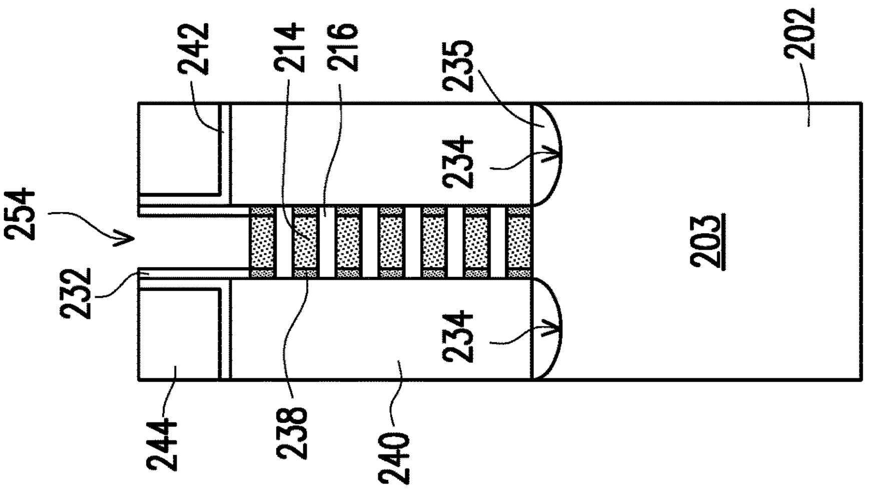
Figure 17C:
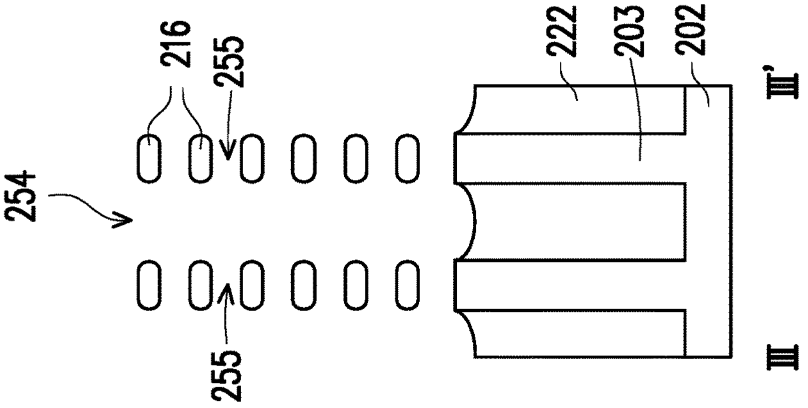

Referring to Referring to FIG. 16A and FIG. 16B, the dummy gate stack 224 (including the dummy gate electrode layer 228 and the dummy gate dielectric layer 226) is removed to form a gate trench 254. The ILD layer 244 and the CESL layer 242 protect the stained layers 240 during the removal of the dummy gate stack 224. The dummy gate stack 224 may be removed using plasma dry etching and/or wet etching. When the dummy gate electrode layer 228 is polysilicon and the ILD layer 244 is silicon oxide, a wet etchant such as a TMAH solution may be used to selectively remove the dummy gate electrode layer. The dummy gate dielectric layer 226 is then removed using plasma dry etching and/or wet etching.

Figure 17B:
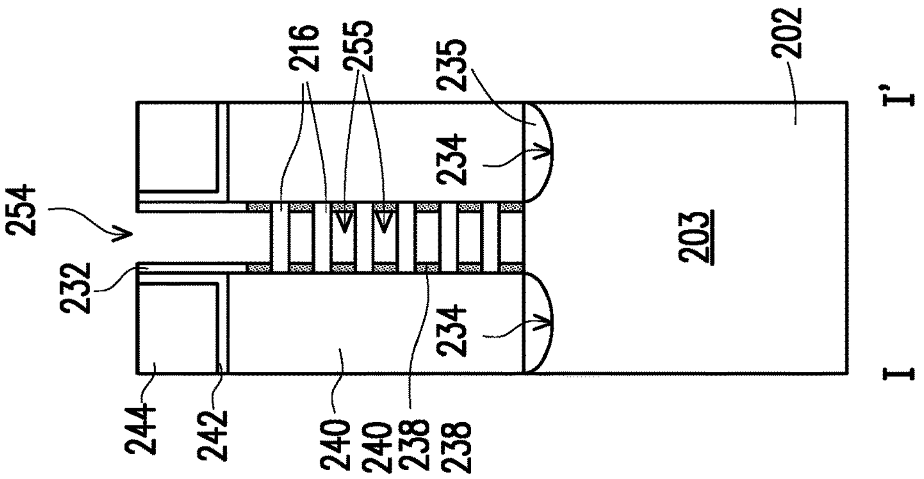
Figure 17A:
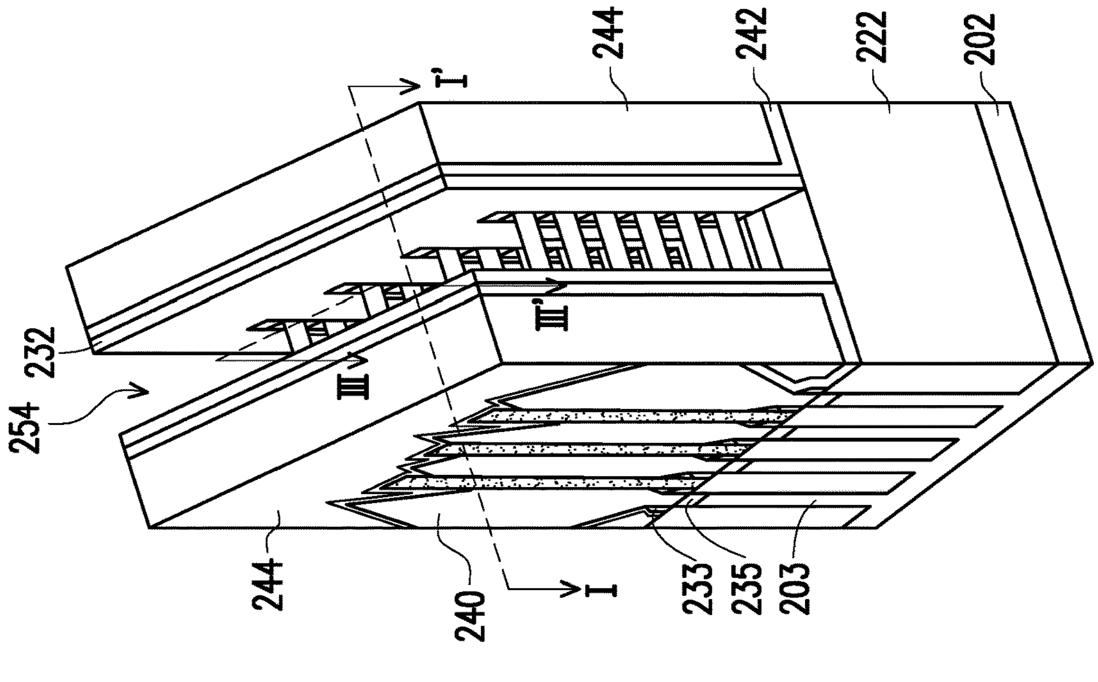

Referring to Referring to FIG. 17A, FIG. 17B and FIG. 17C, channel members (or called channel regions) are defined for the GAA device 200. In some embodiments, an etching process is performed to remove the first nanosheets 214. In the case, the first nanosheets 214 may be completely removed to form gaps 255 between the second nanosheets 216, as shown in FIG. 17B and FIG. 17C. Accordingly, the second nanosheets 216 are separated from each other by the gaps 255. In addition, the bottommost second nanosheet 216 may also be separated from the fin 203 by the gaps 255. As a result, the second nanosheets 216 are suspended. The opposite ends of the suspended second nanosheets 216 are connected to strained layers 240. In some embodiments, the suspended second nanosheets 216 may be referred to as "channel members" or "channel regions". As shown in FIG. 17B and FIG. 17C, the second nanosheets 216 separated from each and vertically stacked are referred to as a "stack of semiconductor nanosheets" or "stack of semiconductor channels" in some examples.

In some embodiments, a height of the gaps 255 may be about 5 nm to 30 nm. In the present embodiment, the second nanosheets 216 include silicon, and the first nanosheets 214 include silicon germanium. The first nanosheets 214 may be selectively removed by oxidizing the first nanosheets 214 using a suitable oxidizer, such as ozone. Thereafter, the oxidized first nanosheets 214 may be selectively removed from the gate trench 254. In some embodiments, the etching process includes a dry etching process to selectively remove the first nanosheets 214, for example, by applying an HCl gas at a temperature of about 20° C. to about 300° C., or applying a gas mixture of $CF_4$, $SF_6$, and $CHF_3$.

Referring to FIG. 17A, FIG. 17B, FIG. 17C, FIG. 18A, FIG. 18B and FIG. 18C, a gate dielectric layer 256 is formed in the gate trench 254 and the gaps 255. In some embodiments, the gate dielectric layer 256 conformally covers the gate trench 254 to form a U-shape cross-section, and further conformally covers the surface of each gap 255 exposed to the gate trench 254 to form a circle-like shape cross-section. In some embodiments, the gate dielectric layer 256 includes at least one dielectric material, such as a high-k material. Examples of the high-k material include metal oxide, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, the like, or combinations thereof. The high-k material has a dielectric constant less than 8, less than 15, less than 20, or even more. The gate dielectric layer 256 may be formed by CVD, ALD or a suitable method. In one embodiment, the gate dielectric layer 256 is formed by using a highly conformal deposition process, such as ALD in order to ensure the formation of a gate dielectric layer having a uniform thickness around each channel members. The thickness of the gate dielectric layer 256 is in a range from about 0.5 nm to about 3 nm in some embodiments.

In some embodiments, the gate dielectric layer 256 includes an interfacial layer (not shown) formed between each channel members and the high-k material. For example, the interfacial layer wraps each of the second nanosheets 216 in the channel regions. The interfacial layer may be deposited or thermally grown respectively on the second nanosheets 216 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The thickness of the interfacial layer is in a range from about 0.7 nm to about 2.5 nm in some embodiments.

Thereafter, a gate electrode 258 is formed on the gate dielectric layer 256 to surround each of the second nanosheets 216. In some embodiments, the gate electrode 258 completely fills the gate trench 254 and the gaps 255. In some embodiments, the gate electrode 258 may include one or more conductive materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloy, a suitable material, or a combination thereof. The gate electrode 258 may be formed by CVD, ALD, electro-plating, or other suitable method. The gate dielectric layer 256 and the gate electrode 258 may also be deposited over the upper surfaces of the ILD layer 244 and the CESL 242. The gate dielectric layer 256 and the gate electrode 258 formed over the ILD layer 244 and the CESL 242 are then planarized by using, for example, CMP, until the top surfaces of the ILD layer 244 and the CESL 242 are revealed. In some embodiments, after the planarization operation, the gate electrode 258 is recessed and a cap insulating layer (not shown) is formed over the recessed gate electrode 258. The cap insulating layer includes one or more layers of a silicon nitride-based material, such as SiN. The cap insulating layer may be formed by depositing an insulating material followed by a planarization operation.

In other embodiments, one or more work function adjustment layers (not shown) are interposed between the gate dielectric layer 256 and the gate electrode 258. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TiN, TiC, Co, TiAl, HfTi, TiSi and TaSi is used as the work function adjustment layer, and for the p-type device, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type device and the p-type device which may use different metal layers.

In some embodiments, the gate electrode 258 and the gate dielectric layer 256 constitute a gate structure 260. Upon the formation of the gate structure 260, a semiconductor device 200 of the embodiment is thus accomplished. In some embodiment, the liner layer 235 is configured to line the bottom surfaces and the sidewalls of the strained layers 240. The liner layer 235 is beneficial for epitaxially growing the strained layers 240. In some embodiment, the blocking wall BW is provided between two adjacent strained layers 240 at the same side to prevent the undesired merge or connection of strained layers. Accordingly, the blocking wall BW of the disclosure provides a benefit of epitaxial strained features with fewer merge defect and better device performance.

The above embodiments of configurations of the strained layers and the blocking walls are provided for illustration purposes, and are not construed as limiting the present disclosure. The configurations in cross-section views of the strained layers and blocking layers may be modified upon the customer requirements. Specifically, the local cross-sectional views in FIG. 19 to FIG. 33 can be applied to the semiconductor device 200 of FIGS. 18A to 18C. Various configurations in cross-section views of the strained layers and blocking layers are described in details below taken along the line II-II' (see FIG. 13A and FIG. 18A) in FIG. 19 to FIG. 33.

Referring to FIG. 19 to FIG. 28, strained layers 240*a* to 240*d* (collectively referred to as "strained layers 240") are respectively grown from fins 203*a*-203*d* (collectively referred to as "fins 203"). In some embodiments, the strained layers 240*a* to 240*d* are disposed over the fins 203*a*-203*d* with a liner layer 235 therebetween. The liner layer 235 is regarded as part of strained layer in some examples. In other embodiments, the strained layers 240*a* to 240*d* are in direct contact with the fins 203*a*-203*d* without a liner layer therebetween.

In some embodiments, the strained layers 240*a* and 240*b* are configured for an n-type device, and the strained layers 240*c* and 240*d* are configured for a p-type device. However, the disclosure is not limited thereto. In other embodiments, the strained layers 240*a* to 240*d* are all configured for an n-type device or a p-type device.

In some embodiments, at least one of the blocking walls BW1-BW3 (collectively referred to as "blocking walls BW") is disposed on the insulating regions 222 between two adjacent strained layers of the strained layers 240*a* to 240*d*. For example, as shown in FIG. 19-21 and FIGS. 24-26, the blocking wall BW1 is formed on the insulating region 222 between the strained layers 240*a* and 240*b*, the blocking wall BW2 is formed on the insulating region 222 between the strained layers 240*b* and 240*c*, and the blocking wall BW3 is formed on the insulating region 222 between the strained layers 240*c* and 240*d*. For example, as shown in FIG. 22-23 and FIGS. 27-28, at least one of the blocking walls (e.g., blocking walls BW2 and BW3) may be omitted as needed.

In some embodiments, the height H of each of the blocking walls BW1-BW3 ranges from about 1 nm to 100 nm, such as from about 10 nm to 50 nm, and the width W of each of the blocking walls BW1-BW3 ranges from about 1 nm to 40 nm, such as from about 5 nm to 30 nm. The heights and/or widths of the blocking walls BW1-BW3 may be the same or different due to the process variation or customer requirement.

In some embodiments, the top surface BWt of the blocking wall BW is higher than the top surface 240*t* of the adjacent strained layer 240. However, the disclosure is not limited thereto. In other embodiments, the top surface of the blocking wall BW is lower than the top surface of the adjacent strained layer 240 but higher than the turning point of the sidewall of the adjacent strained layer 240. The top corners of the blocking wall BW may be sharp or rounded according to process variation.

In some embodiments, the bottom surface BWb of the blocking wall BW is flushed with the top surface 222*t* of the insulating region 222. However, the disclosure is not limited thereto. In other embodiments, the insulating region 222 may have a curved or dishing top surface, and the bottom surface of the blocking wall BW is conformal to the top surface of the insulating region 222 and therefore have a curved or convex bottom profile.

In some embodiments, the bottom surfaces 241 of the strain layers 240 are conformal to the top surfaces 203*t* of the fins 203. The bottom surfaces 241 of the strain layers 240 may be disposed at the same level or different levels due to the process variation or customer requirement.

In some embodiments, the blocking wall BW has a rectangle-like shape in cross-section, and the included angle θ1 between the sidewall of the blocking wall BW and the top surface of insulating region 222 is about 90 degrees. However, the disclosure is not limited thereto. In some embodiments, the blocking wall BW has a trapezoid-like shape, and the included angle θ2 between the sidewall of the blocking wall BW and the top surface of insulating region 222 is greater than 90 degrees and less than 100 or 130 degrees, as shown in the enlarged view R1 in FIG. 19. In some embodiments, the blocking wall BW has an inverted-trapezoid-like shape, and the included angle θ3 between the sidewall of the blocking wall BW and the top surface of insulating region 222 is less than 90 degrees and greater than 60 or 80 degrees, as shown in the enlarged view R2 in FIG. 19. The angle range of the blocking wall with trapezoid shape in the enlarged view R1 and the angle range of the blocking wall with inverted-trapezoid-like shape in the enlarged view R2 can be applied to the blocking walls BW in FIG. 20 to FIG. 28.

In some embodiments, the lateral epitaxial growth distance d1 of the strained layer 240 to the adjacent blocking wall BW ranges from about 0 to 20 nm, such as from about 1 to 10 nm. The lateral epitaxial growth distance d1 of the strained layer 240 is defined as a distance from a sidewall abutting the spacer 233 to a sidewall abutting the blocking layer BW. As shown in the enlarged views R1 and R2, the lateral epitaxial growth distance d2 or d3 of the strained layer 240 to the adjacent blocking wall BW ranges from about 0 to 20 nm, such as from about 1 to 10 nm. The lateral epitaxial growth distance of the blocking wall with trapezoid shape in the enlarged view R1 and the lateral epitaxial growth distance of the blocking wall with inverted-trapezoid-like shape in the enlarged view R2 can be applied to the blocking walls BW in FIG. 20 to FIG. 28.

In some embodiments, the CESL 242 conformally covers the top surfaces and upper sidewalls of the strained layers 240 and the blocking walls BW, without covering the lower sidewalls of the strained layers 240 and the blocking walls BW. A pair of spacers 233 are disposed aside each of the strained layers 240 and below the turning point. In some embodiments, an air gap AG is present between the strained layer 240 and the adjacent blocking wall BW or spacer 233. However, the disclosure is not limited thereto. In other embodiments, the space between the strained layer 240 and the adjacent blocking wall BW is filled with the ILD layer 244.

Figure 19:
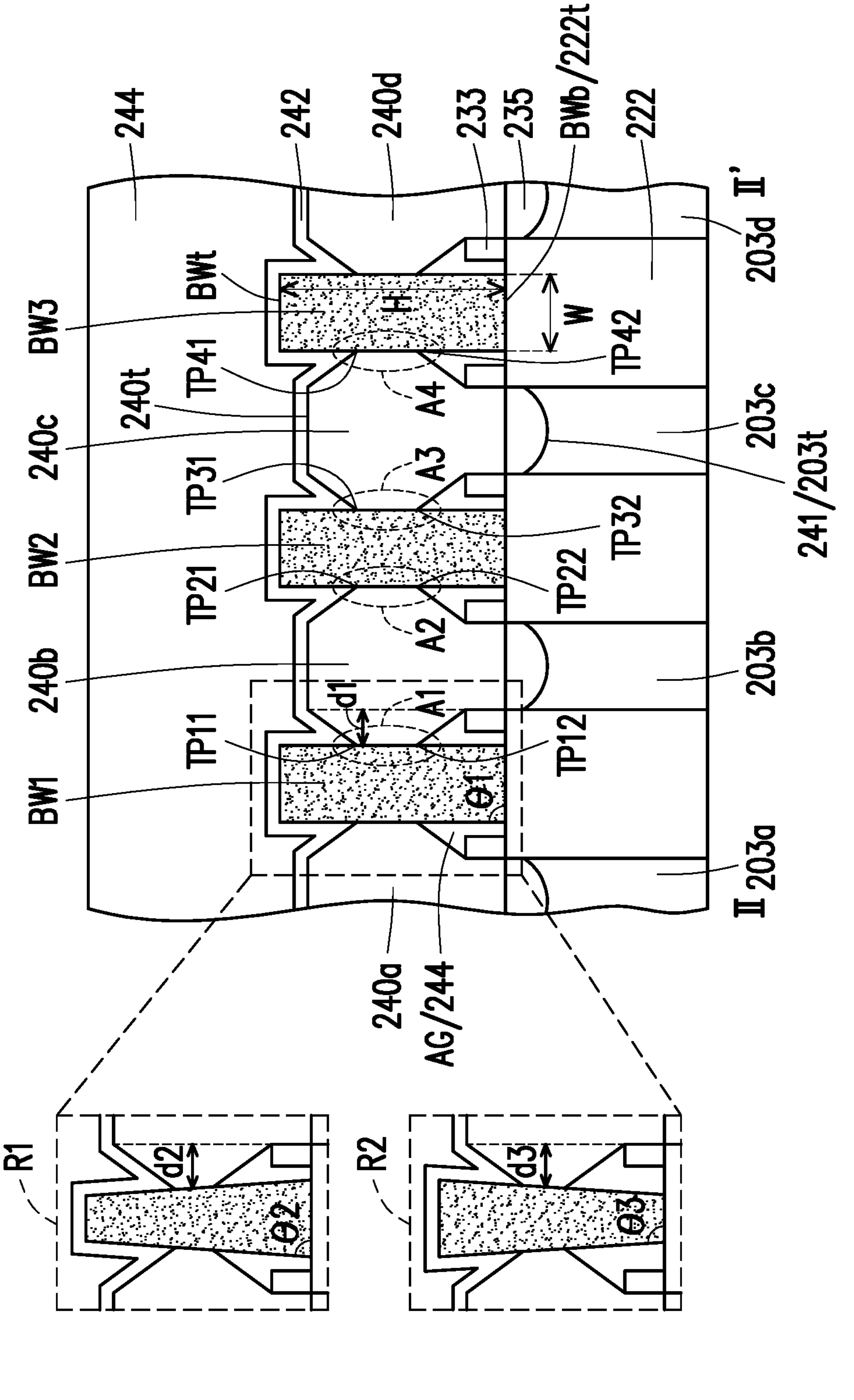
FIG. 19 to FIG. 33 schematically illustrate local cross-sectional views of various semiconductor devices in accordance with some embodiments.

In some embodiments, as shown in FIG. 19, the adjacent strained layers 240*b* and 240*c* have similar profile and symmetrical profile, and portions of the sidewalls of the strained layers 240*b* and 240*c* are conformal to and in direct to the adjacent blocking walls BW1 to BW3. In some embodiments, the contact area A1 between the strained layer 240*b* and the blocking wall BW1 is substantially the same with the contact area A2 between the strained layer 240*b* and the blocking wall BW2. In some embodiments, the contact area A2 between the strained layer 240*b* and the blocking wall BW2 is substantially the same with the contact area A3 between the strained layer 240*c* and the blocking wall BW2. In some embodiments, the contact area A3 between the strained layer 240*c* and the blocking wall BW2 is substantially the same with the contact area A4 between the strained layer 240*c* and the blocking wall BW3. In some embodiments, the strained layer 240*b* have two turning points TP11 and TP12 at one side and two turning points TP21 and T22 at the opposite side. In some embodiments, the strained layer 240*c* have two turning points TP31 and TP32 at one side and two turning points TP41 and TP42 at the opposite side. From another point of view, in a certain cross-section, the blocking wall BW2 is in "surface contact" with the strained layer 240*b* and in "surface contact" with the strained layer 240*c*.

Figure 20:
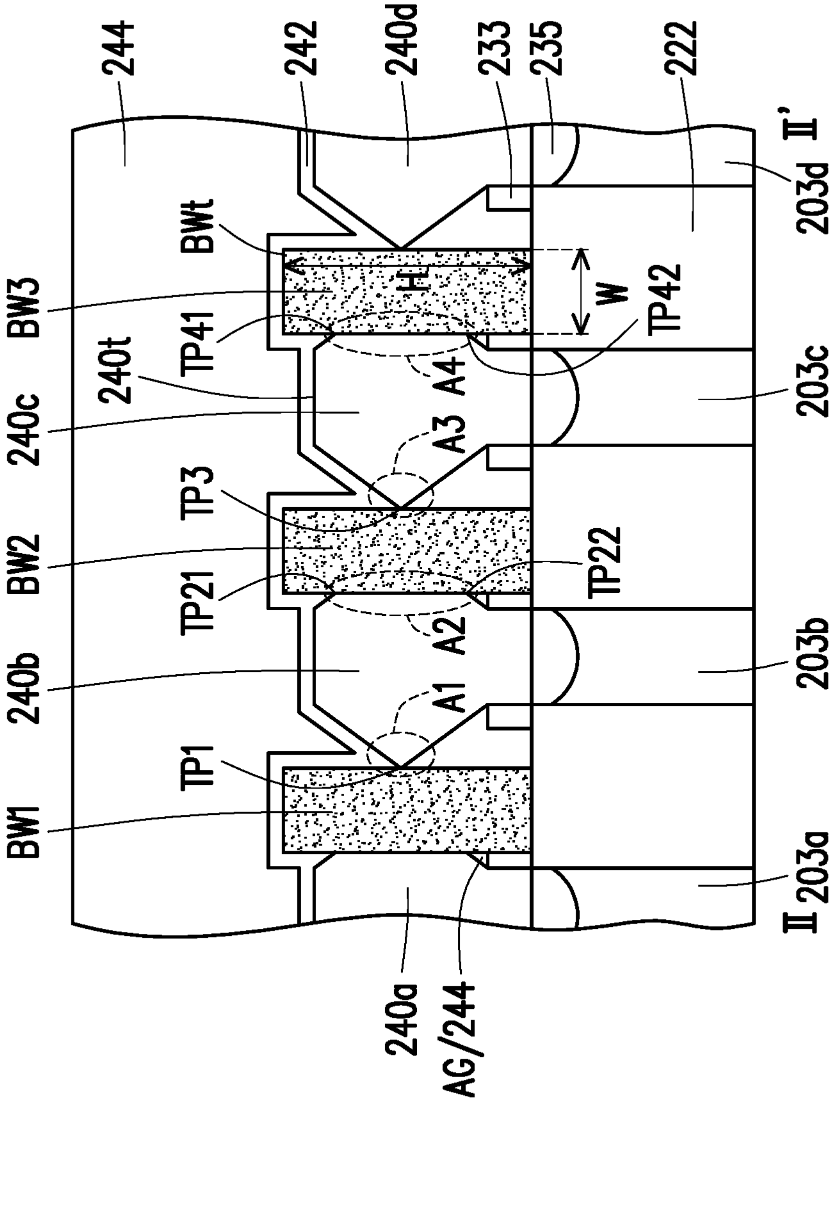

The local cross-sectional view of FIG. 20 is similar to the local cross-sectional view of FIG. 19, and the different between them lies in that the locations of the blocking walls BW1-BW3. In FIG. 19, the blocking wall BW is disposed along an central axis between two adjacent strained layers 240. However, in FIG. 20, the blocking wall BW is shifted by a distance (e.g., about 1-15 nm) from the central axis between two adjacent strained layers 240. Accordingly, the adjacent strained layers 240*b* and 240*c* have similar profile but unsymmetrical profile. In some embodiments, the contact area A1 is different from (e.g., less than) the contact area A2, the contact area A2 is different from (e.g., greater than) the contact area A3, and the contact area A3 is different from (e.g., less than) the contact area A4. From another point of view, in a certain cross-section, the blocking wall BW2 is in "surface contact" with the strained layer 240*b* while in "point contact" with the strained layer 240*c*.

Figure 21:
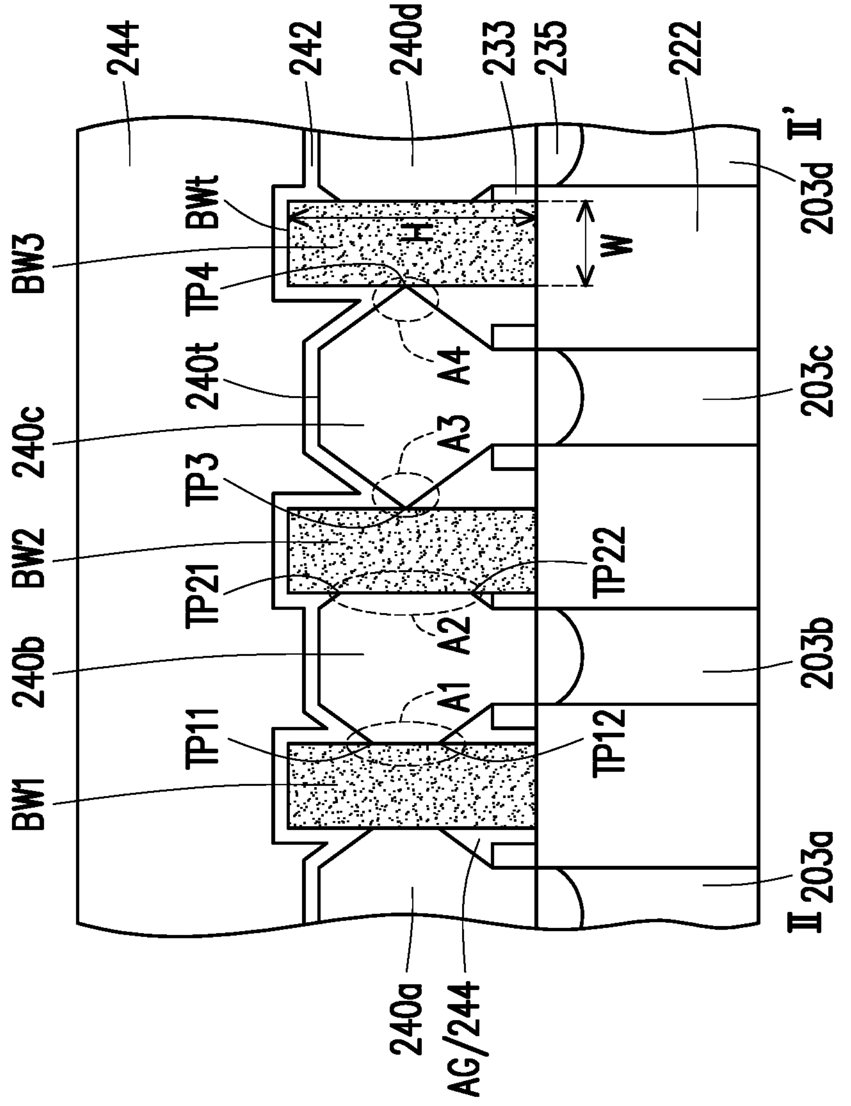

The local cross-sectional view of FIG. 21 is similar to the local cross-sectional view of FIG. 19, and the different between them lies in that the locations of the blocking walls BW1-BW3. In FIG. 19, each of the blocking walls BW is disposed along an central axis between two adjacent strained layers 240. However, in FIG. 21, the blocking wall BW1 is disposed along an central axis between two adjacent strained layers 240, while each of the blocking walls BW2 and BW3 is shifted by a distance (e.g., about 1-15 nm) from the central axis between two adjacent strained layers 240. In some embodiments, the blocking walls BW2 and BW3 are shifted towards opposite directions. Accordingly, the adjacent strained layers 240*b* and 240*c* have different and unsymmetrical profiles. In some embodiments, the contact area A1 is different from (e.g., less than) the contact area A2, the contact area A2 is different from (e.g., greater than) the contact area A3, and the contact area A3 is substantially the same as the contact area A4. In some embodiments, the strained layer 240*b* have two turning points TP11 and TP12 at one side and two turning points TP21 and T22 at the opposite side. In some embodiments, the strained layer 240*c* have one turning point TP3 at one side and one turning point TP4 at the opposite side.

Figure 22:
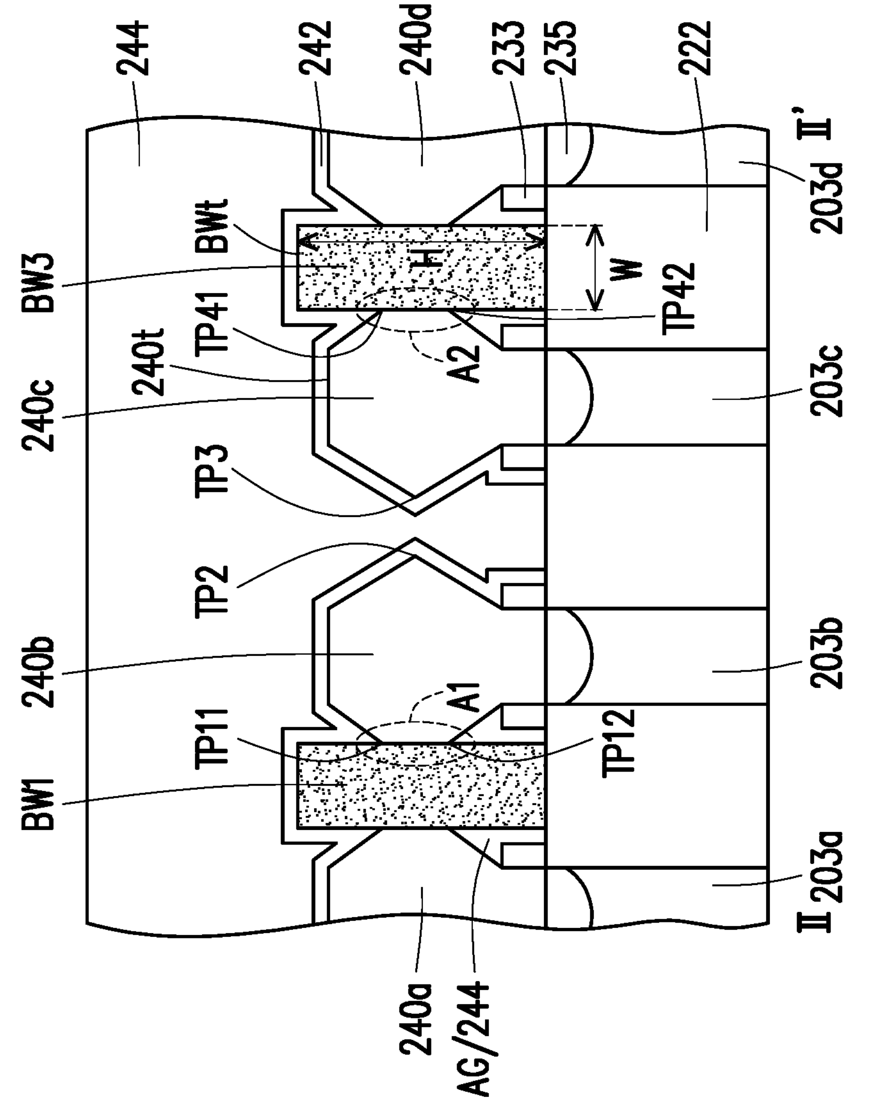
Figure 23:
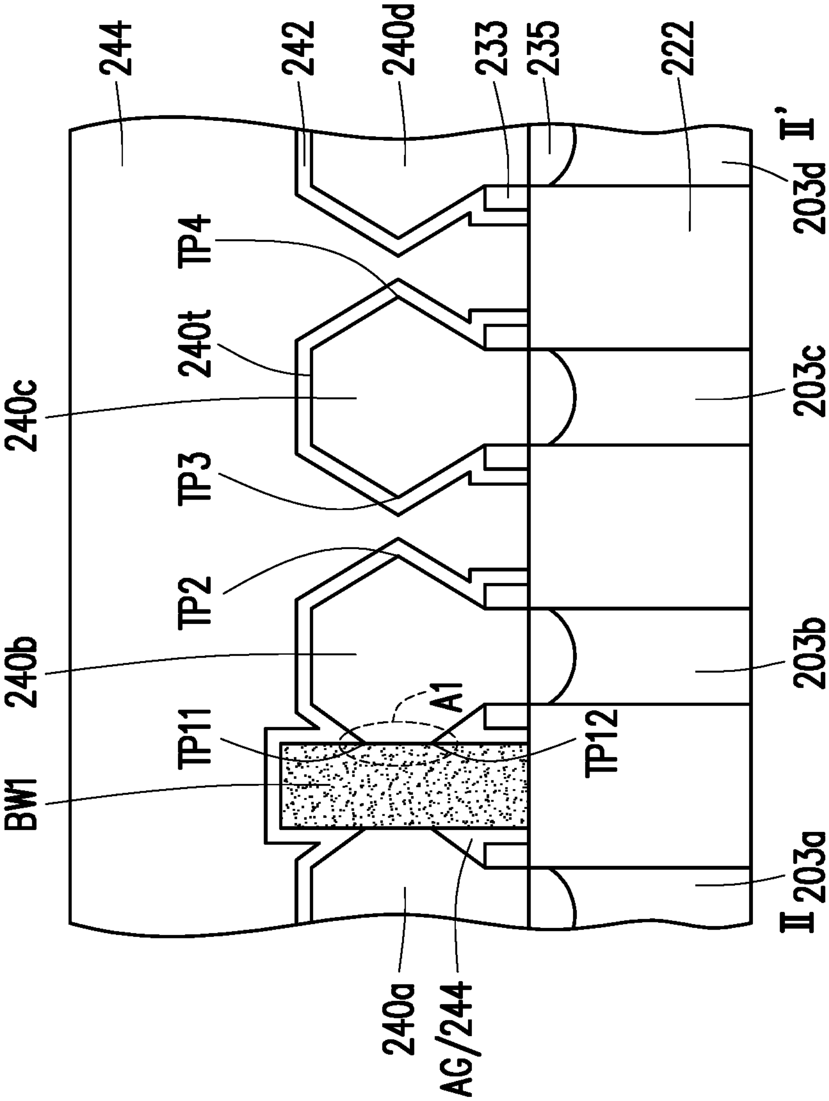
Figure 24:
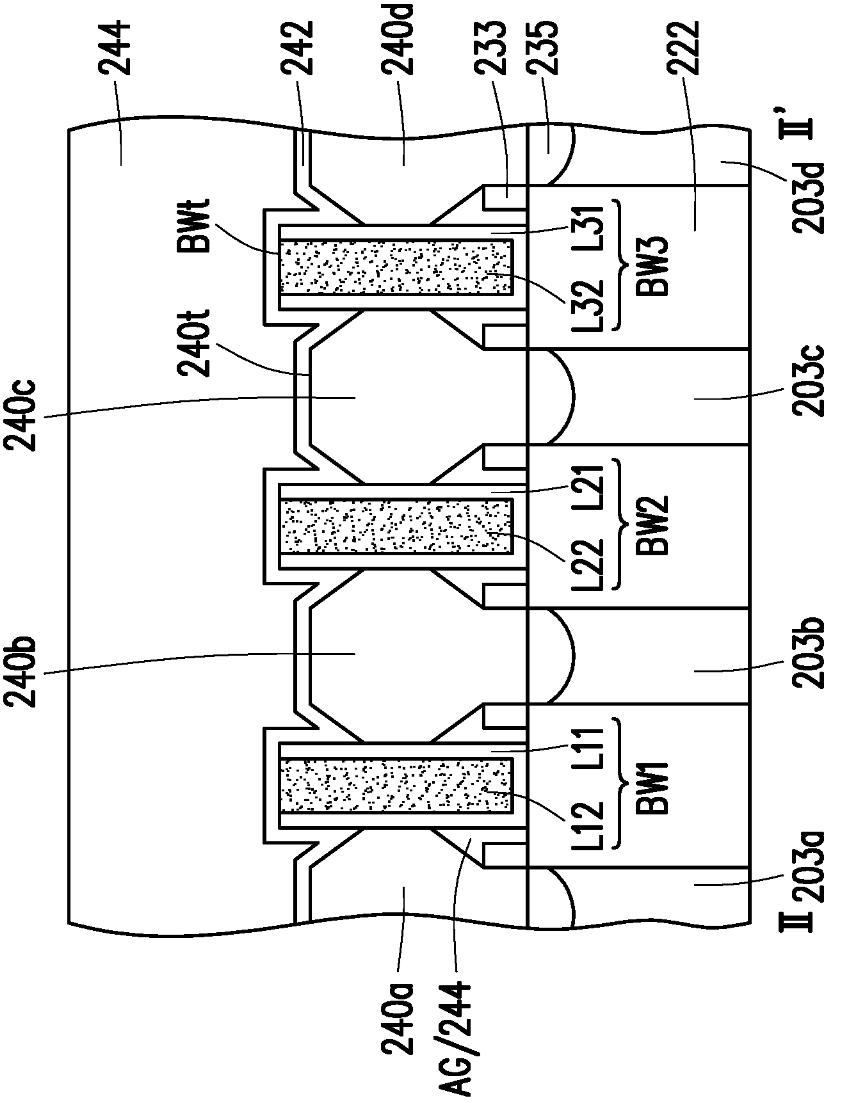
Figure 25:
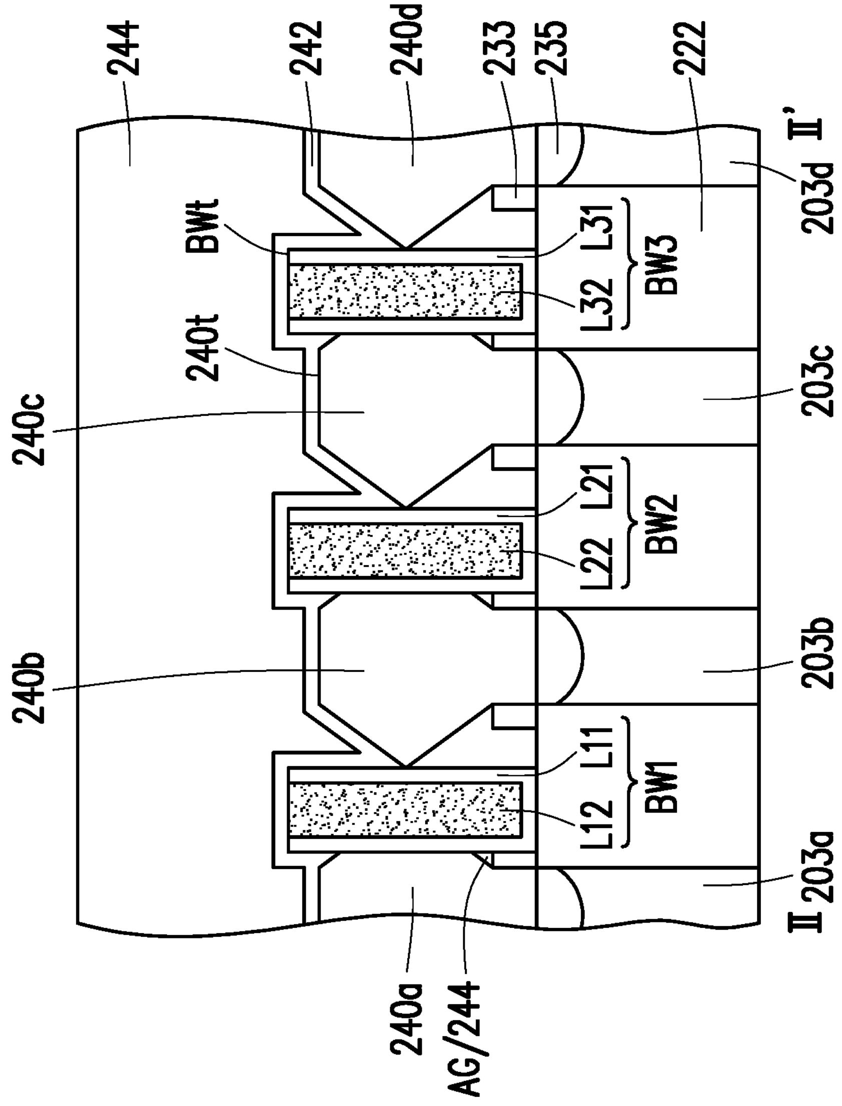
Figure 26:
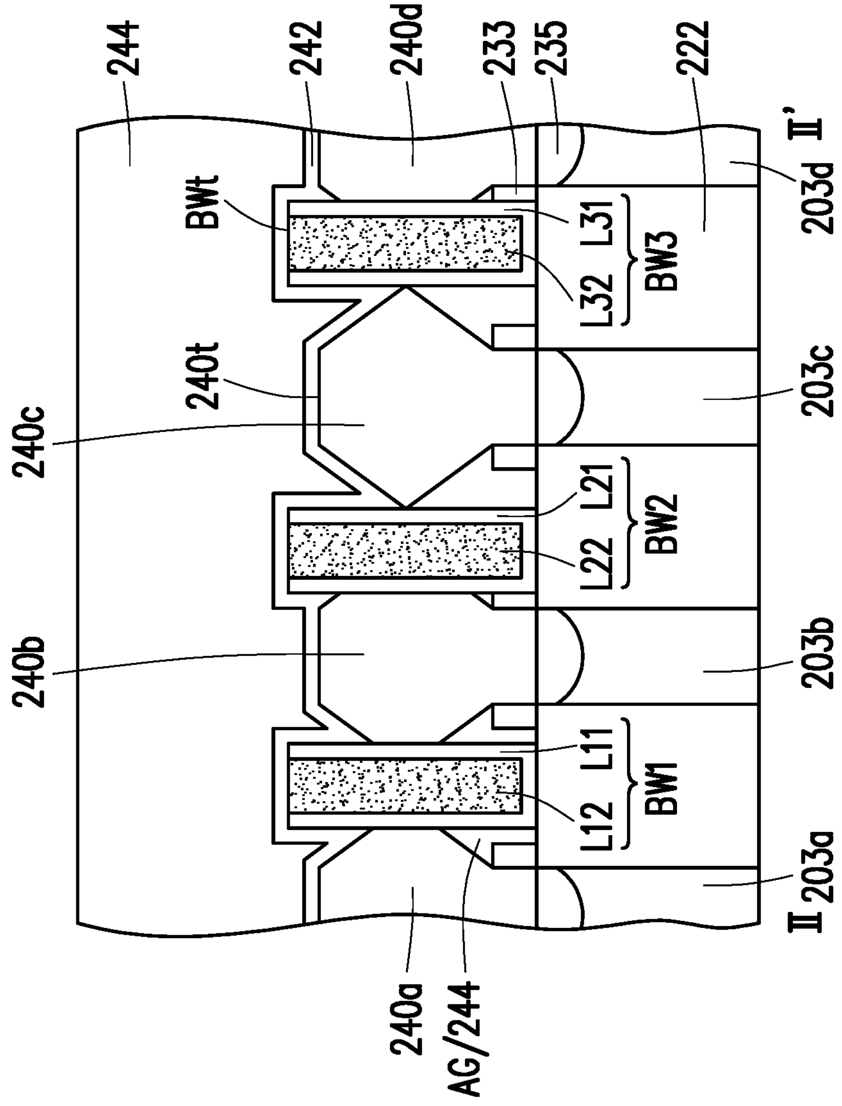
Figure 27:
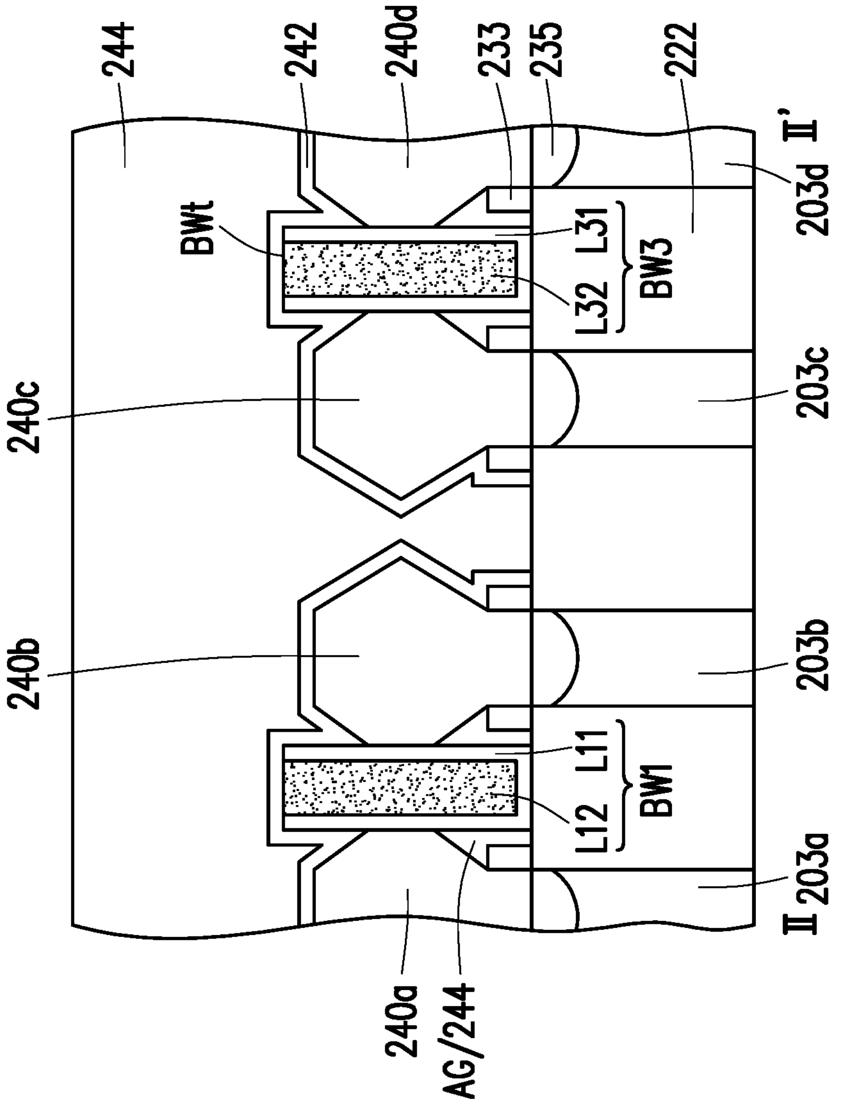
Figure 28:
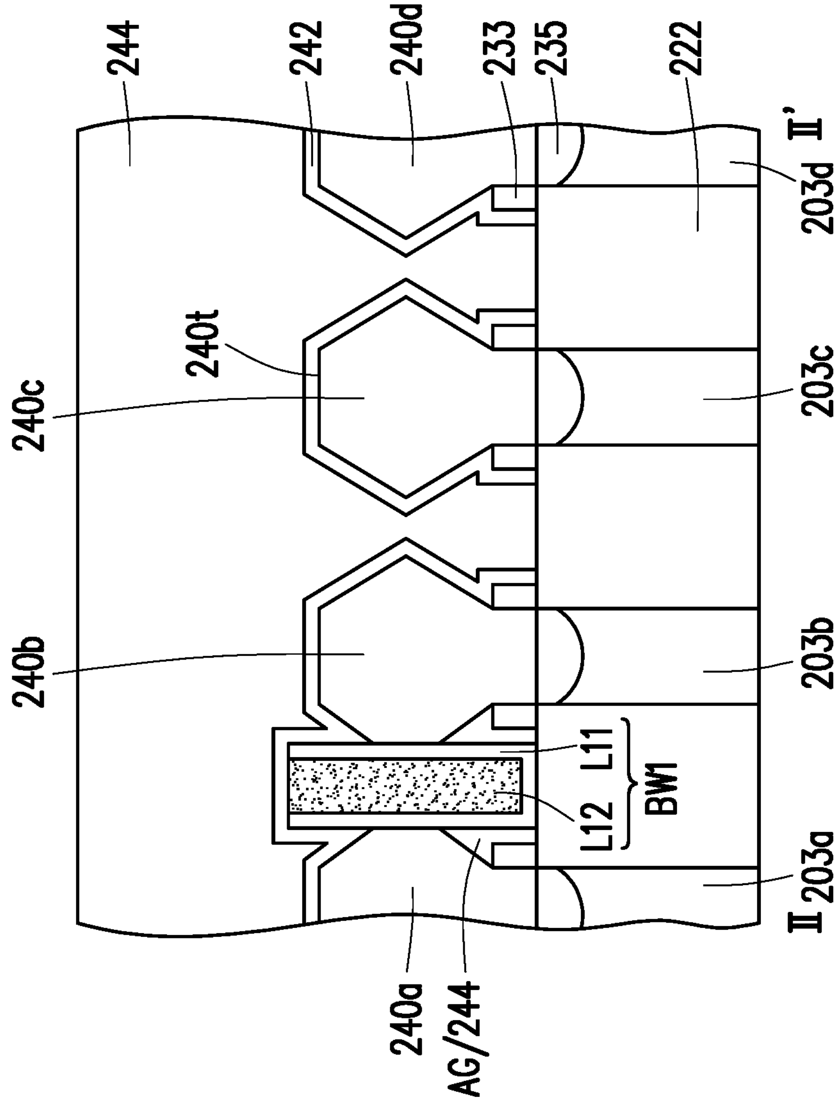
Figure 29:
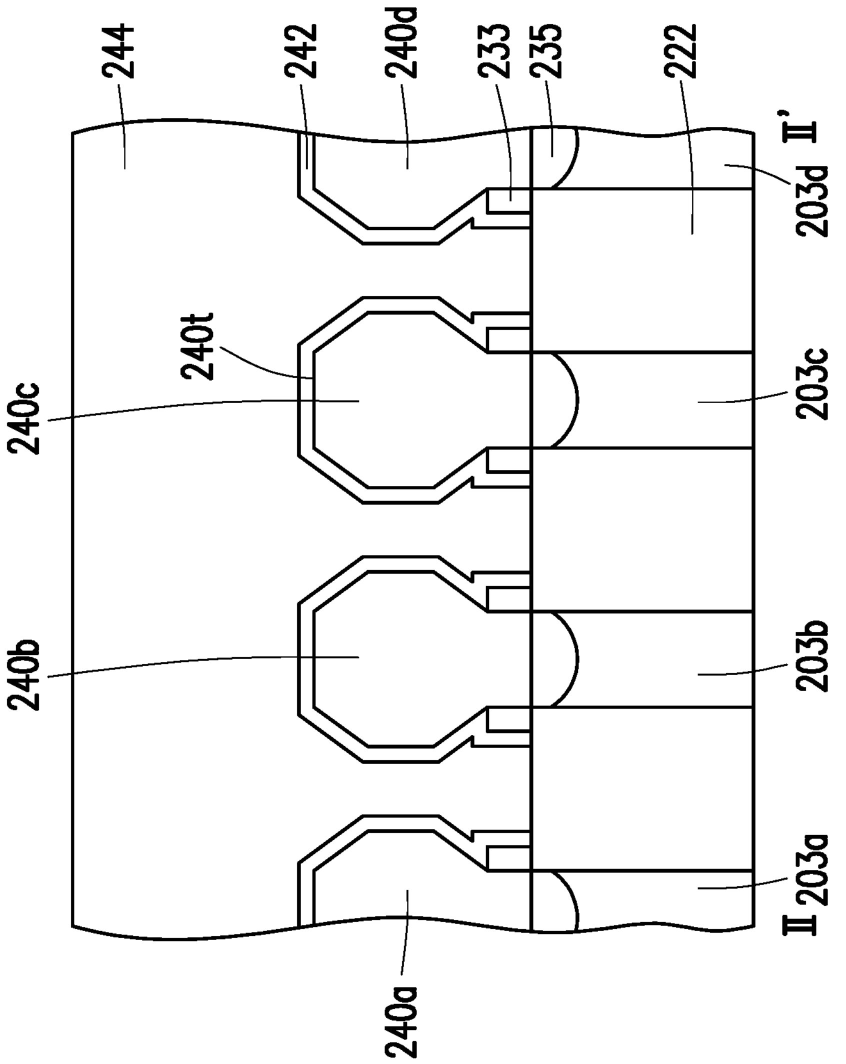
Figure 30:
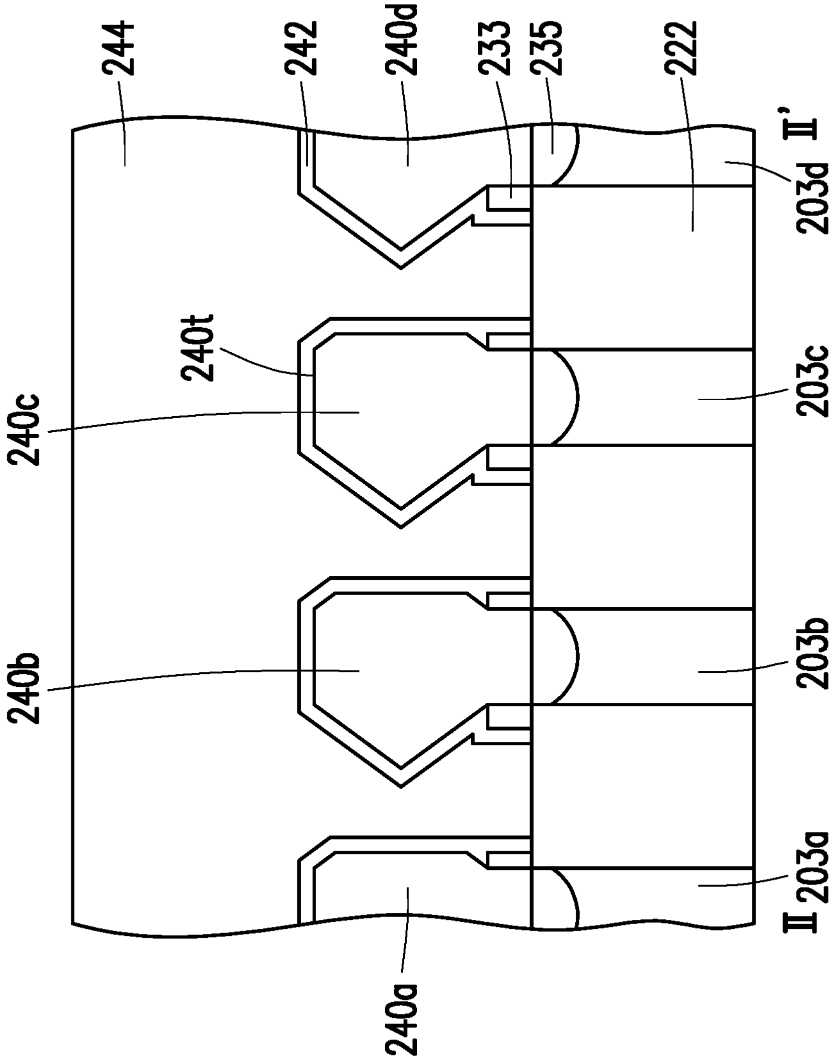
Figure 31:
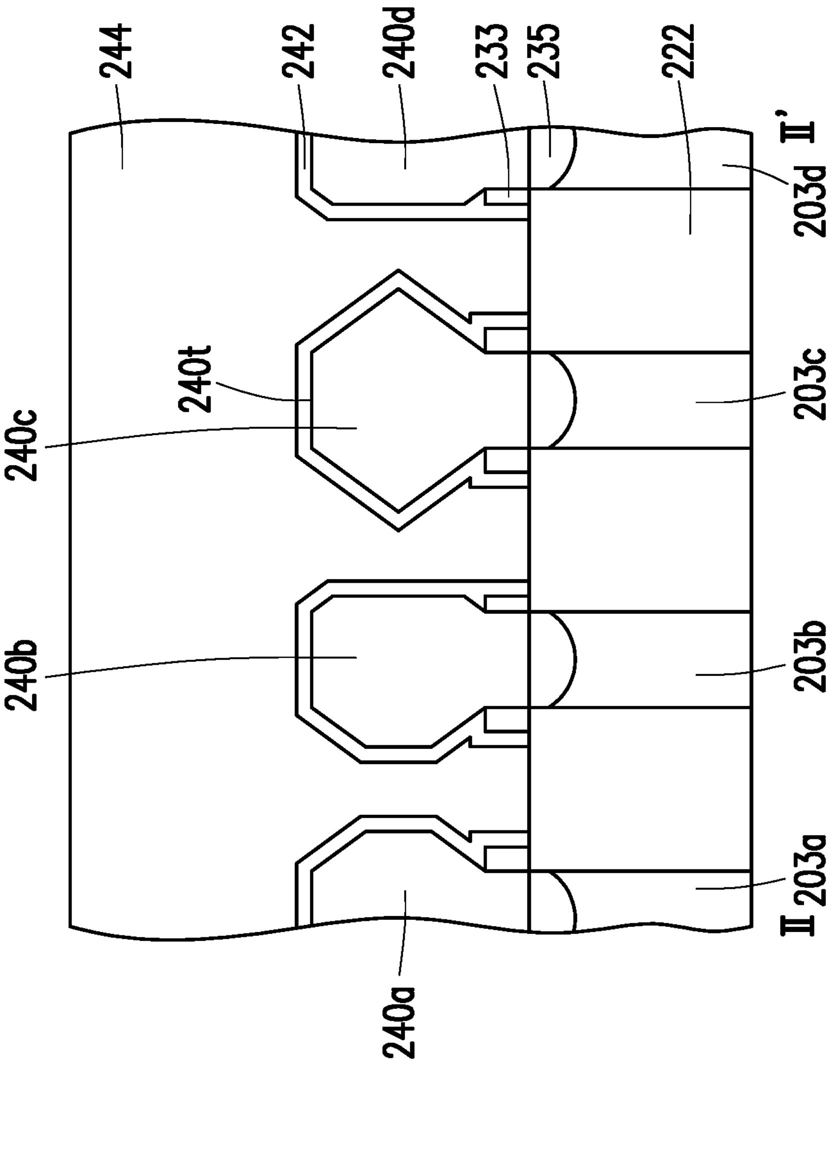
Figure 32:
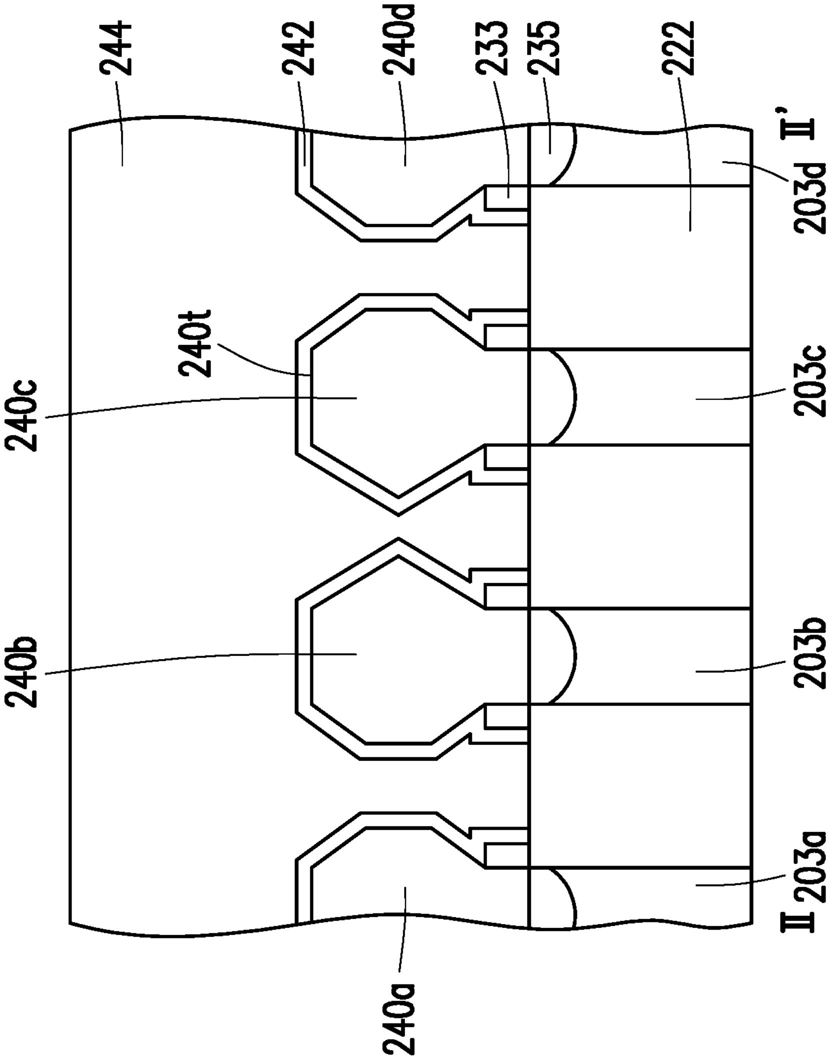
Figure 33:
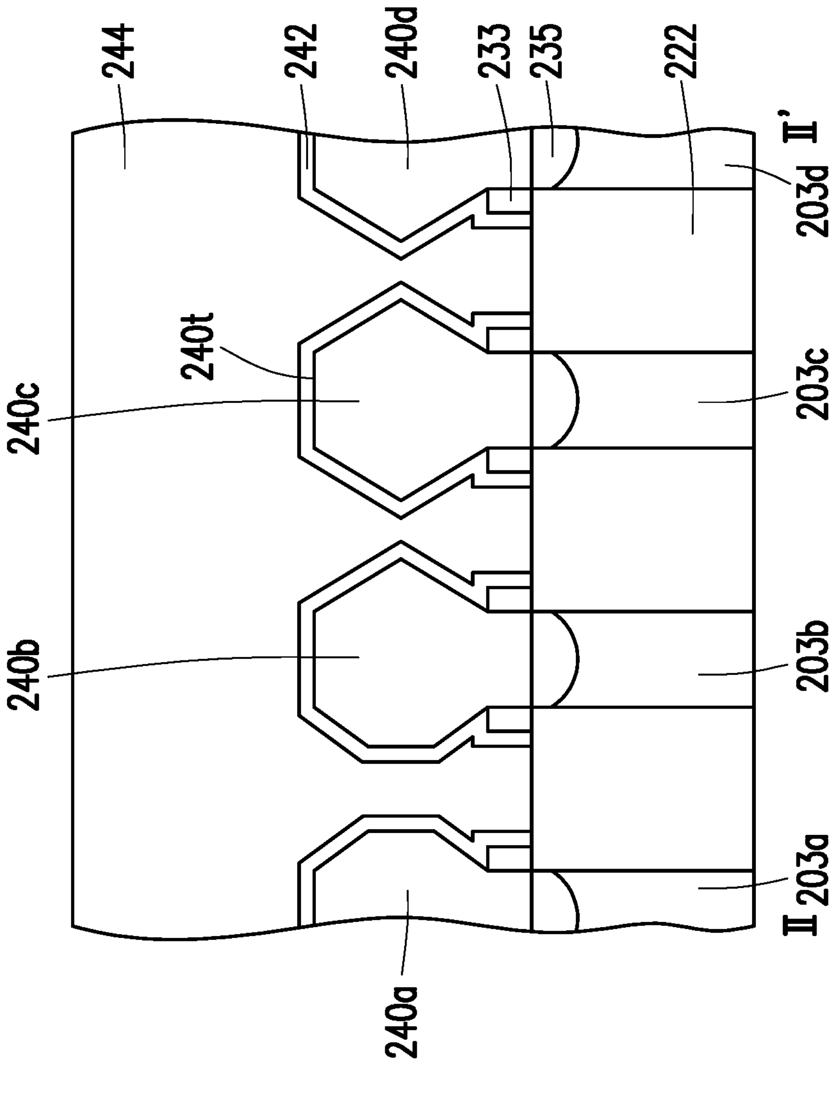

FIG. 22 and FIG. 23 illustrate the embodiments in which at least of the blocking walls BW1-BW3 of FIG. 19 may be omitted as needed.

In FIG. 22, one blocking wall BW1 is provided between the strained layers 240 for an n-type device, one blocking wall BW3 is provided between the strained layers 240 for a p-type device, and no blocking wall is disposed between the n-type device region and the p-type device region.

In FIG. 23, one blocking wall BW1 is provided between the strained layers 240 for an n-type device, while no blocking wall is provided for a p-type device, and no blocking wall is disposed between the n-type device region and the p-type device region.

The local cross-sectional views of FIGS. 24-28 are similar to the local cross-sectional views of FIGS. 19-23, and the different between them lies in that the materials or structures of the blocking walls BW1-BW3. In the local cross-sectional views of FIGS. 19-23, the blocking walls have a single-layer structure. In the local cross-sectional views of FIGS. 24-28, the blocking walls have a multi-layer structure. In some embodiments, the blocking wall BW1 includes a first blocking layer L11 and a second blocking layer L12 over the first blocking layer L11, the blocking wall BW2 includes a first blocking layer L21 and a second blocking layer L22 over the first blocking layer L21, and the blocking wall BW3 includes a first blocking layer L31 and a second blocking layer L32 over the first blocking layer L31. The first and second blocking layers include different materials.

The local cross-sectional views of FIGS. 29-33 are similar to The local cross-sectional views of FIGS. 19-23, and the different between them lies in that in FIGS. 19-23, blocking walls BW are completely removed after the formation of the strained layers 240 and before the formation of the contact etch stop layer 242. Accordingly, the contact etch stop layer 242 is conformally formed on the top surface and the side surface of the strained layer 240 and along the sidewall of the spacer 233 abutting the strained layer 240.

Figure 34A:
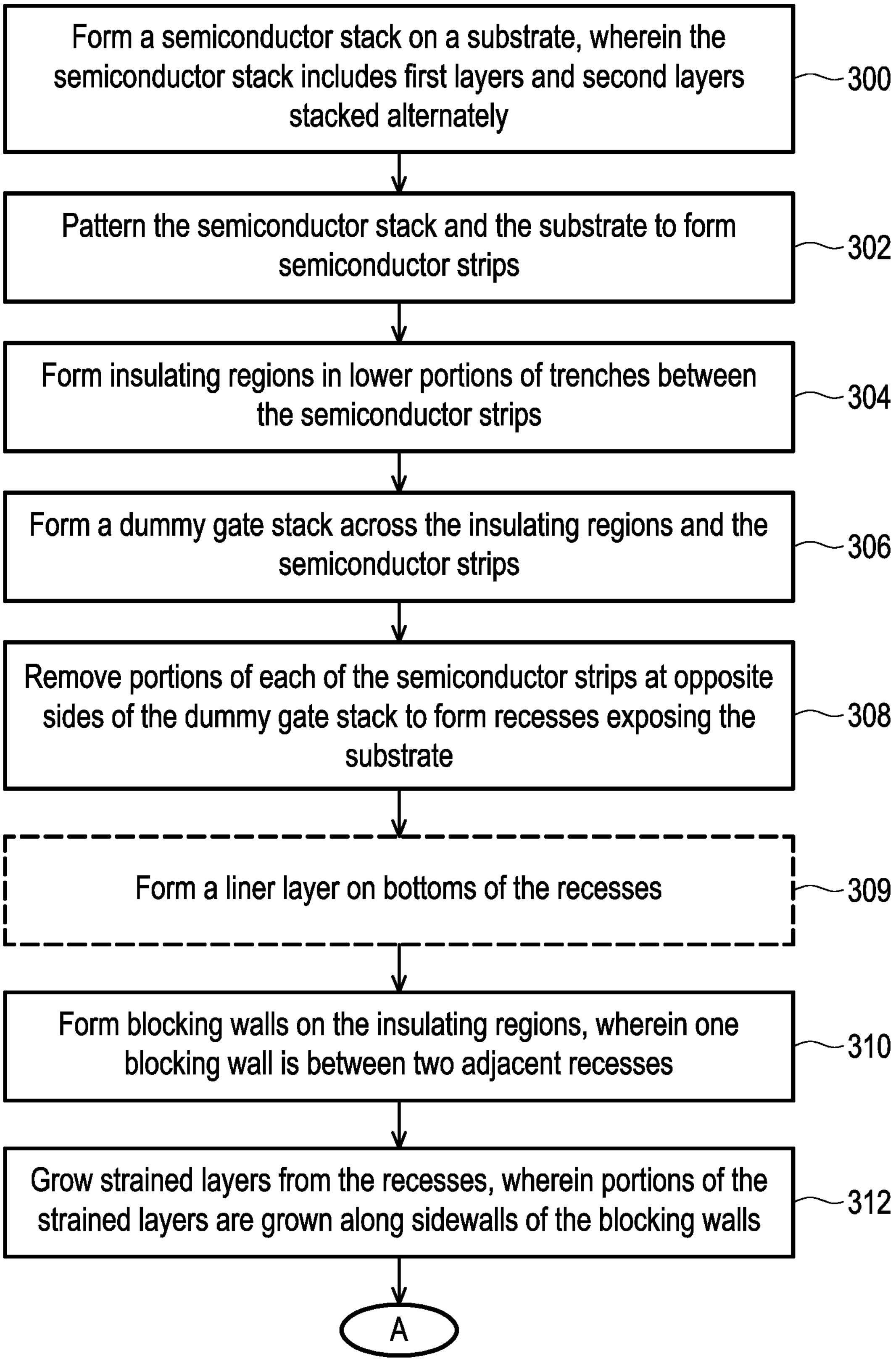
FIG. 34A to FIG. 34B illustrate a flow chart of a method of forming a semiconductor structure in accordance with some embodiments.
Figure 34B:
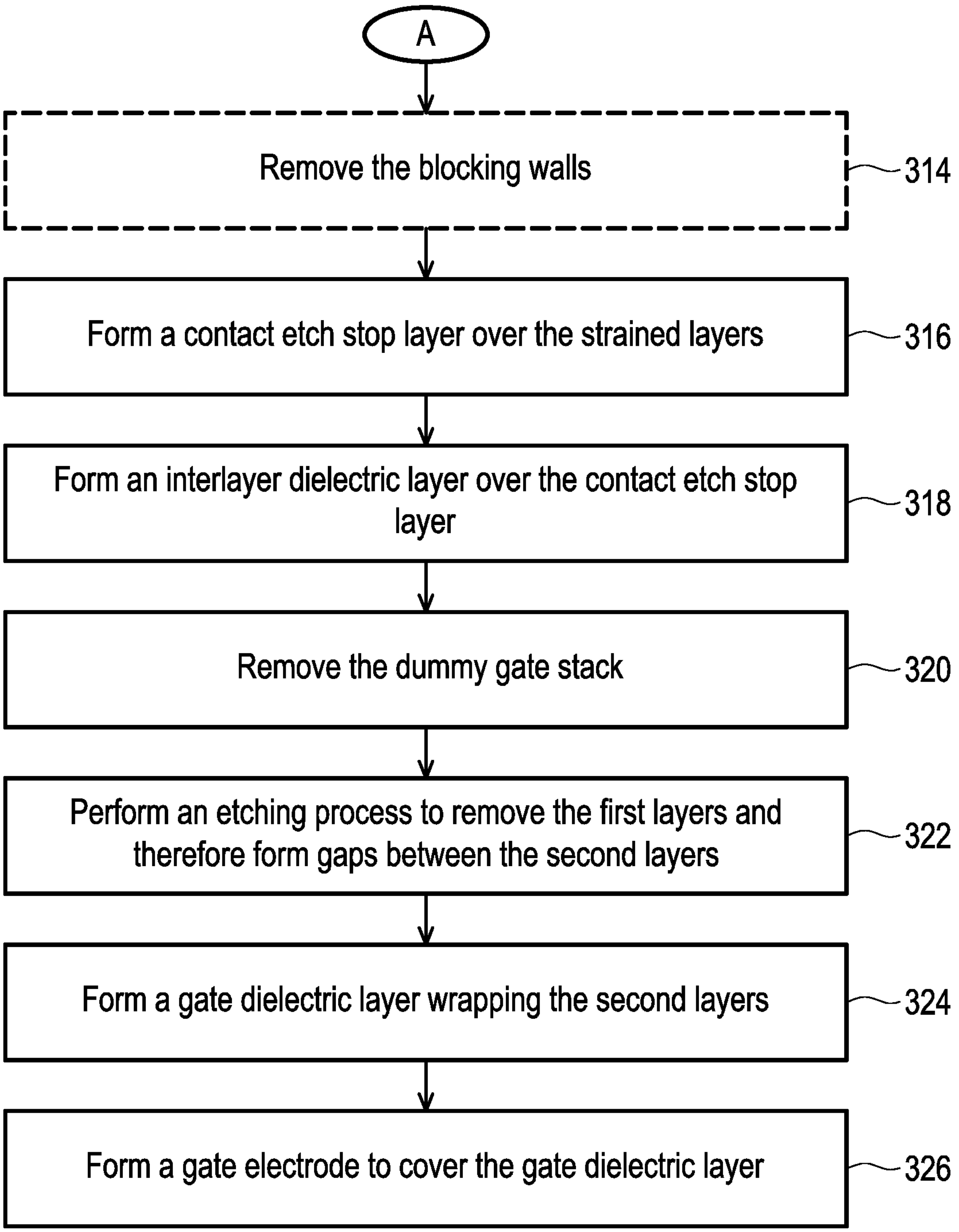

FIG. 34A to FIG. 34B illustrate a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 300, a semiconductor stack is formed on a substrate, wherein the semiconductor stack includes first layers and second layers stacked alternately. FIG. 1 illustrates a perspective view corresponding to some embodiments of act 300.

At act 302, the semiconductor stack and the substrate are patterned to form semiconductor strips. FIG. 1 to FIG. 2 illustrate perspective views corresponding to some embodiments of act 302.

At act 304, insulating regions are formed in lower portions of trenches between the semiconductor strips. FIG. 3 to FIG. 4 illustrate perspective views corresponding to some embodiments of act 304.

At act 306, a dummy gate stack is formed across the insulating regions and the semiconductor strips. FIG. 5 illustrates a perspective view corresponding to some embodiments of act 306.

At act 308, portions of each of the semiconductor strips at opposite sides of the dummy gate stack are removed to form recesses exposing the substrate. FIG. 6A to FIG. 7B illustrate perspective and cross-sectional views corresponding to some embodiments of act 308.

In some embodiments, after act 308 of forming the recesses and before act 310 of forming the blocking walls, the method further includes laterally recessing the first layers to form cavities, and forming inner spacers in the cavities, as shown in FIG. 8A to FIG. 9B.

At act 309, a liner layer is formed on bottoms of the recesses. FIG. 10A to FIG. 10B illustrate perspective and cross-sectional views corresponding to some embodiments of act 309. Act 309 is optional and may be omitted as need. In some embodiments, when act 309 is omitted from the method, the subsequently formed stained layers are in direct contact with fins protruding from the substrate. In some embodiments, act 309 may be performed after act 310 of forming the blocking walls and before act 312 of growing strained layers.

At act 310, blocking walls are formed on the insulating regions, wherein one blocking wall is between two adjacent recesses. In some embodiments, a method of forming the blocking walls includes the following operations. A hard mask layer with openings is formed, wherein one of the openings is disposed between two adjacent recesses at the same side. A blocking wall material is formed over the hard mask layer, wherein the blocking wall material fills in the openings. The blocking wall material is etched back. The hard mask layer is removed. FIG. 11A to FIG. 12B illustrate perspective and cross-sectional views corresponding to some embodiments of act 310.

At act 312, strained layers are grown from the recesses, wherein portions of the strained layers are grown along sidewalls of the blocking walls. FIG. 13A to FIG. 13B illustrate perspective and cross-sectional views corresponding to some embodiments of act 312. In some embodiments, an air gap is formed between one of the blocking walls and the adjacent strained layer. FIG. 19 to FIG. 28 illustrate local cross-sectional views corresponding to some embodiments of act 312.

At act 314, the blocking walls are removed. FIG. 29 to FIG. 33 illustrate local cross-sectional views corresponding to some embodiments of act 314. Act 314 is optional and may be omitted as need. FIG. 19 to FIG. 28 illustrate local cross-sectional views corresponding to some embodiments when act 314 is omitted from the method. In some embodiments, top surfaces of the blocking walls are lower than the top surfaces of the strained layers when the blocking walls are partially removed at act 314.

At act 316, a contact etch stop layer is formed over the strained layers. FIG. 14A to FIG. 14B illustrate perspective and cross-sectional views corresponding to some embodiments of act 316.

At act 318, an interlayer dielectric layer is formed over the contact etch stop layer. FIG. 14A to FIG. 14B illustrate perspective and cross-sectional views corresponding to some embodiments of act 318.

At act 320, the dummy gate stack is removed. FIG. 15A to FIG. 16B illustrate perspective and cross-sectional views corresponding to some embodiments of act 320.

At act 322, an etching process is performed to remove the first layers and therefore form gaps between the second layers. FIG. 17A to FIG. 17C illustrate perspective and cross-sectional views corresponding to some embodiments of act 322.

Figure 18A:
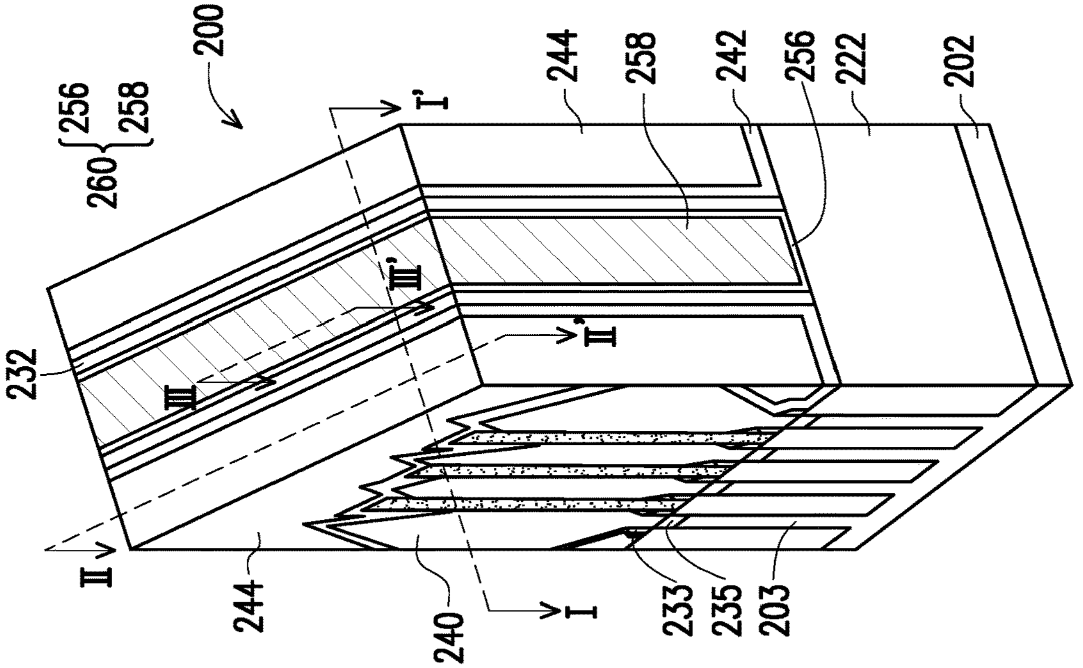
Figure 18B:
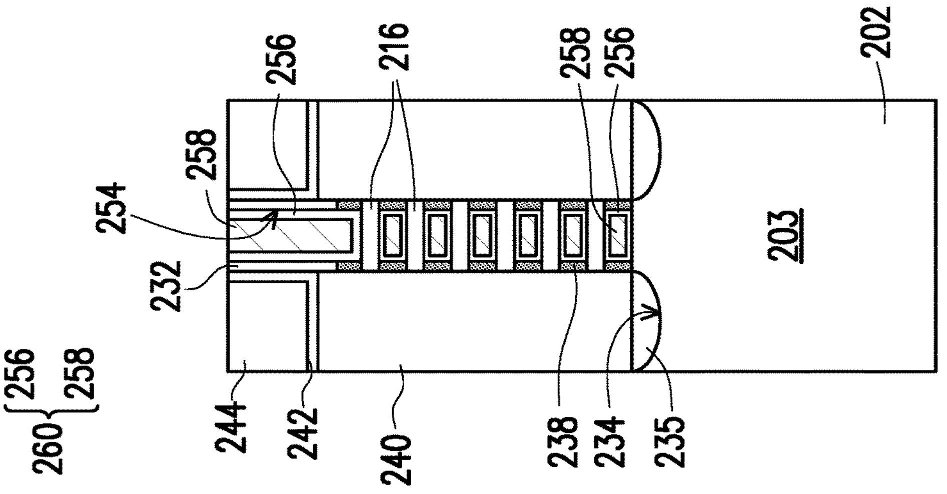
Figure 18C:
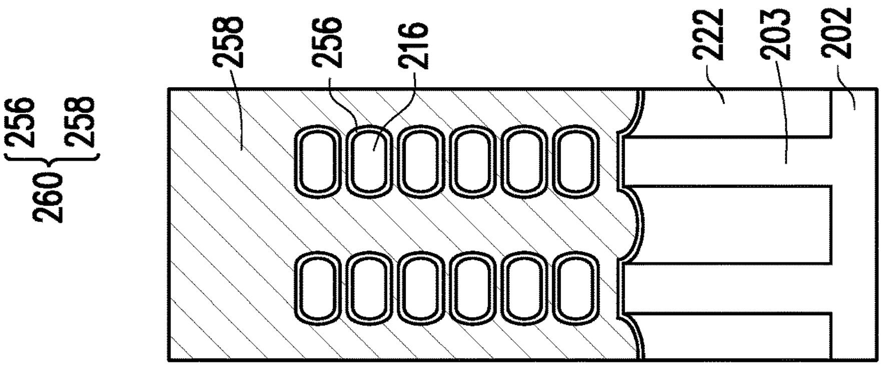

At act 324, a gate dielectric layer is formed to wrap the second layers. FIG. 18A to FIG. 18C illustrate perspective and cross-sectional views corresponding to some embodiments of act 324.

At act 326, a gate electrode is formed to cover the gate dielectric layer. FIG. 18A to FIG. 18C illustrate perspective and cross-sectional views corresponding to some embodiments of act 326.

Figure 35A:
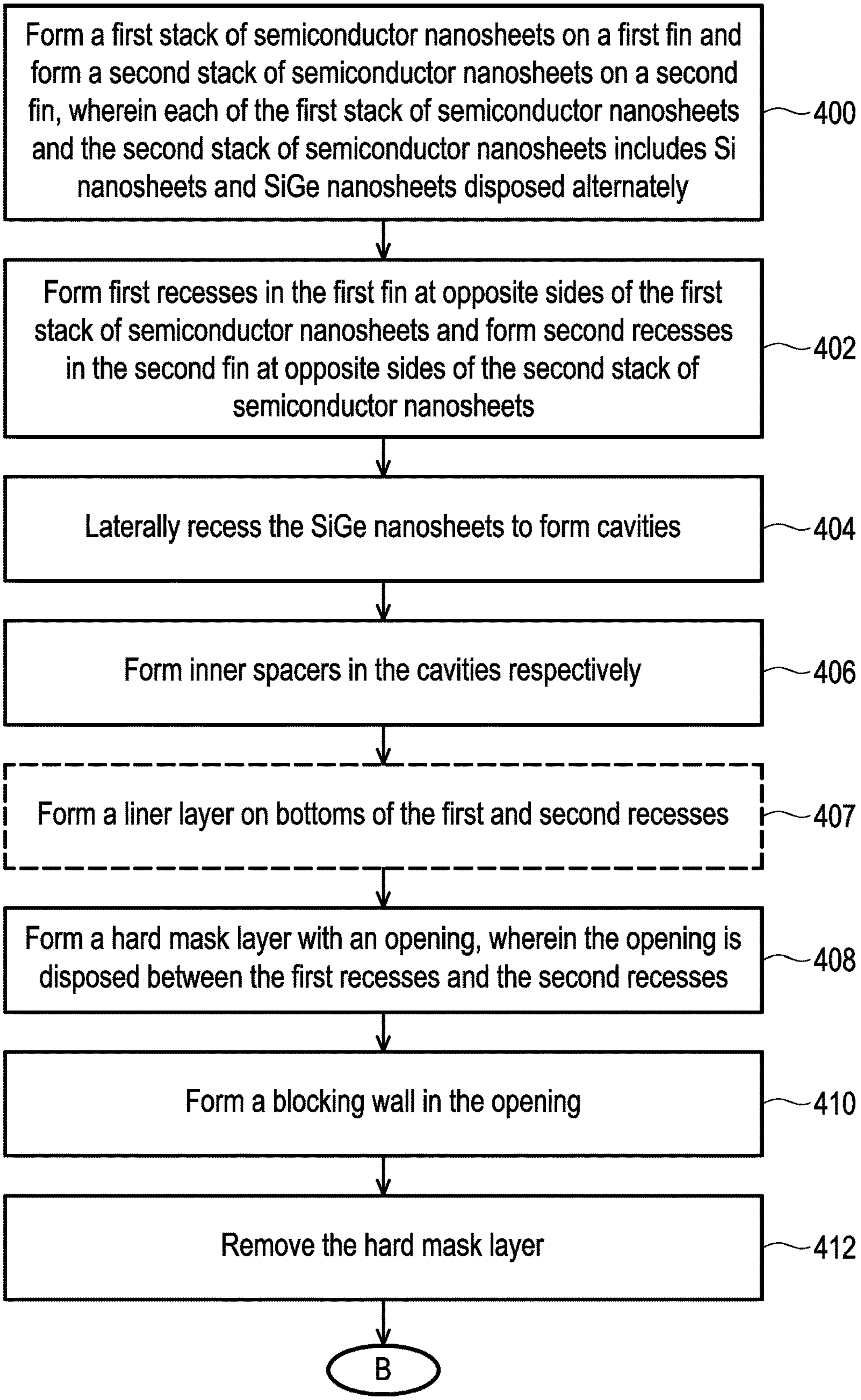
FIG. 35A to FIG. 35B illustrate a flow chart of a method of forming a semiconductor structure in accordance with some embodiments.
Figure 35B:
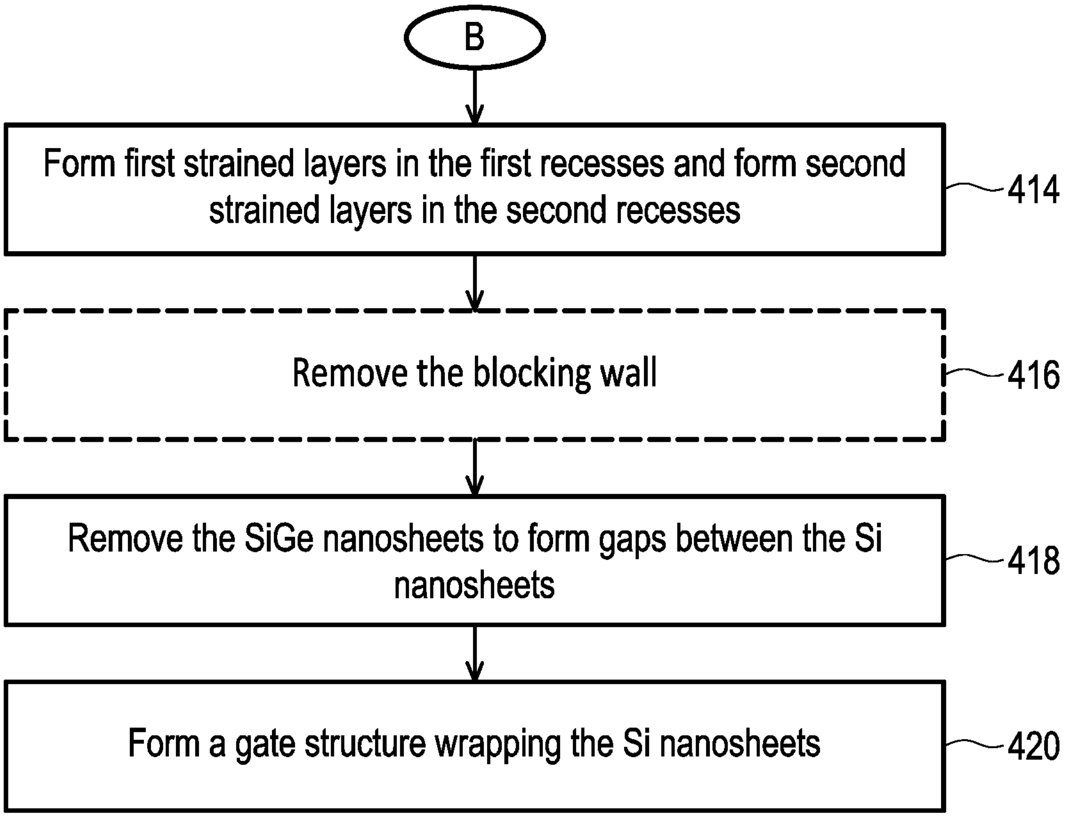

FIG. 35A to FIG. 35B illustrate a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a first stack of semiconductor nanosheets is formed on a first fin and a second stack of semiconductor nanosheets is formed on a second fin, wherein each of the first stack of semiconductor nanosheets and the second stack of semiconductor nanosheets includes Si nanosheets and SiGe nanosheets disposed alternately. FIG. 1 to FIG. 4 illustrate perspective views corresponding to some embodiments of act 400.

At act 402, first recesses are formed in the first fin at opposite sides of the first stack of semiconductor nanosheets and second recesses are formed in the second fin at opposite sides of the second stack of semiconductor nanosheets. FIG. 5 to FIG. 7B illustrate perspective and cross-sectional views corresponding to some embodiments of act 402.

At act 404, the SiGe nanosheets are laterally recessed to form cavities. FIG. 8A to FIG. 8B illustrate perspective and cross-sectional views corresponding to some embodiments of act 404.

Figure 9B:
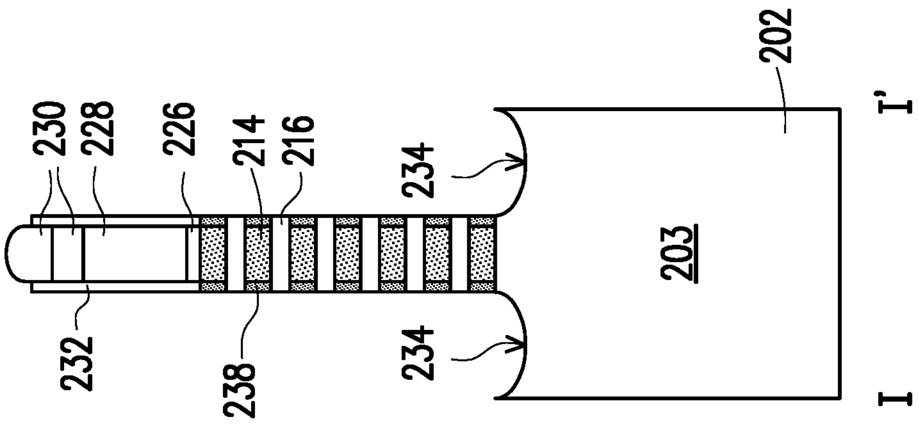
Figure 9A:
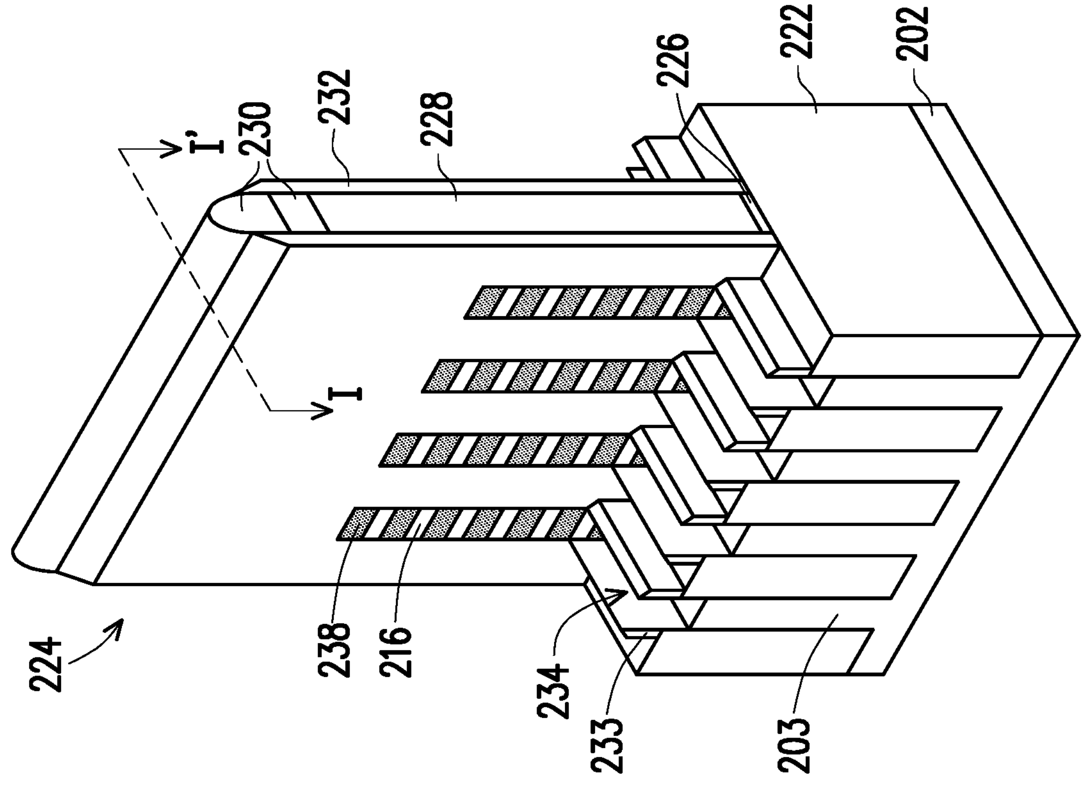

At act 406, inner spacers are formed in the cavities respectively. FIG. 9A to FIG. 9B illustrate perspective and cross-sectional views corresponding to some embodiments of act 406.

At act 407, a liner layer is formed on bottoms of the first and second recesses. FIG. 10A to FIG. 10B illustrate perspective and cross-sectional views corresponding to some embodiments of act 407. Act 407 is optional and may be omitted as need. In some embodiments, when act 407 is omitted from the method, the subsequently formed stained layers are in direct contact with fins protruding from the substrate. In some embodiments, act 407 may be performed after act 412 of removing the hard mask and before act 414 of forming first and second strained layers.

At act 408, a hard mask layer is formed with an opening therein, wherein the opening is disposed between the first recesses and the second recesses. FIG. 11A to FIG. 11B illustrate perspective and cross-sectional views corresponding to some embodiments of act 408.

At act 410, a blocking wall is formed in the opening. FIG. 12A to FIG. 12B illustrate perspective and cross-sectional views corresponding to some embodiments of act 410.

At act 412, the hard mask layer is removed. FIG. 12A to FIG. 12B illustrate perspective and cross-sectional views corresponding to some embodiments of act 412.

At act 414, first strained layers are formed in the first recesses and second strained layers are formed in the second recesses. In some embodiments, the first strained layers and the second strained layers include different materials and are formed separately. In other embodiments, the first strained layers and the second strained layers include the same material and are formed simultaneously. FIG. 13A to FIG. 13B illustrate perspective and cross-sectional views corresponding to some embodiments of act 414.

At act 416, the blocking wall is removed after forming the first and second strained layers. FIG. 29 to FIG. 33 illustrate local cross-sectional views corresponding to some embodiments of act 416. Act 416 is optional and may be omitted as need. FIG. 19 to FIG. 28 illustrate local cross-sectional views corresponding to some embodiments when act 416 is omitted from the method.

At act 418, the SiGe nanosheets are removed to form gaps between the Si nanosheets. FIG. 14A to FIG. 17C illustrate perspective and cross-sectional views corresponding to some embodiments of act 418.

At act 420, a gate structure is formed to wrap the Si nanosheets. FIG. 18A to FIG. 18C illustrate perspective and cross-sectional views corresponding to some embodiments of act 420.

Figure 36:
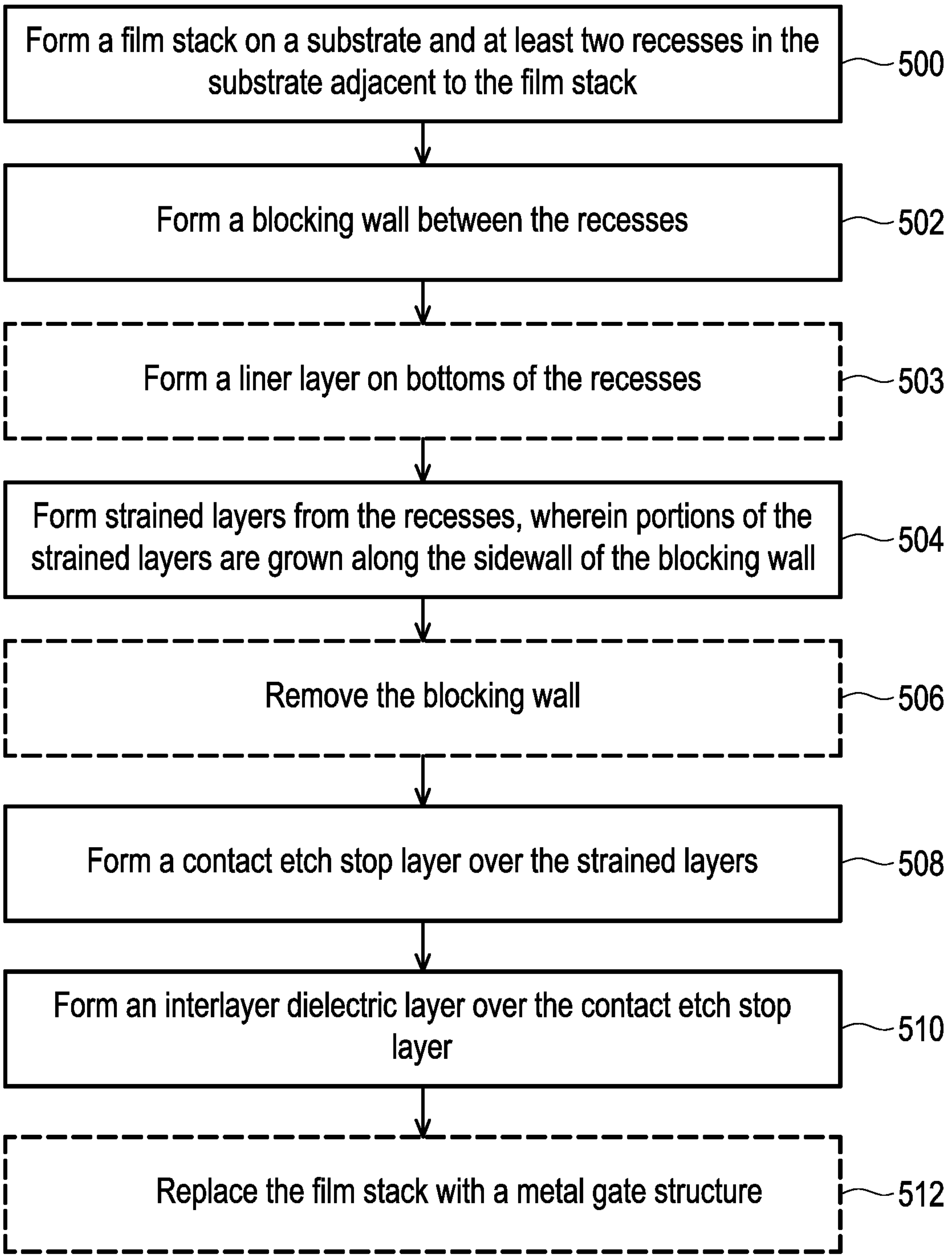
FIG. 36 illustrates a flow chart of a method of forming a semiconductor structure in accordance with some embodiments.

FIG. 36 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 500, a film stack is formed on a substrate and at least two recesses in the substrate adjacent to the film stack. In some embodiments, the two recesses are formed at the same side of the film stack. In some embodiments, the film stack is a dummy gate stack and is subsequently replaced with a metal gate structure (act 512). In other embodiments, the film stack is a functional gate stack such as a polysilicon gate stack or a metal gate stack. In some embodiments, the substrate is a substrate with nanowires. FIG. 1 to FIG. 9B illustrate perspective and cross-sectional views corresponding to some embodiments of act 500. However, the disclosure is not limited thereto. In other embodiments, the substrate is a substrate with fins. In other embodiments, the substrate is a planar substrate without fins.

At act 502, a blocking wall is formed between the recesses. FIG. 11A to FIG. 12B illustrate perspective and cross-sectional views corresponding to some embodiments of act 502.

At act 503, a liner layer is formed on bottoms of the recesses. Act 503 is optional and may be omitted as need. In some embodiments, when act 503 is omitted from the method, the subsequently formed stained layers are in direct contact with fins protruding from the substrate. In some embodiments, act 503 may be performed after act 500 of forming the recesses and before act 502 of forming the blocking wall, as shown in FIG. 10A to FIG. 10B.

At act 504, strained layers are formed from the recesses, wherein portions of the strained layers are grown along the sidewall of the blocking wall. FIG. 13A to FIG. 13B illustrate perspective and cross-sectional views corresponding to some embodiments of act 504.

At act 506, the blocking wall is removed after forming the strained layers. FIG. 29 to FIG. 33 illustrate local cross-sectional views corresponding to some embodiments of act 506. Act 506 is optional and may be omitted as need. FIG. 19 to FIG. 28 illustrate local cross-sectional views corresponding to some embodiments when act 506 is omitted from the method.

At act 508, a contact etch stop layer over the strained layers. FIG. 14A to FIG. 14B illustrate perspective and cross-sectional views corresponding to some embodiments of act 508.

At act 510, an interlayer dielectric layer is formed over the contact etch stop layer. FIG. 14A to FIG. 14B illustrate perspective and cross-sectional views corresponding to some embodiments of act 510.

At act 512, the film stack is replaced with a metal gate structure. In some embodiments, the metal gate structure is a GAA structure. FIG. 15A to FIG. 18C illustrate perspective and cross-sectional views corresponding to some embodiments of act 512. However, the disclosure is not limited thereto. In other embodiments, the metal gate structure is a FinFET structure. In other embodiments, the metal gate structure is a planar device.

The structures of the disclosure are illustrated below. In some embodiments, a semiconductor device 200 includes a substrate 202, a first stack of semiconductor nanosheets (e.g., 216), a second stack of semiconductor nanosheets (e.g., 216), a gate structure 260, a first strained layer (e.g., 240*b*), a second strained layer (e.g., 240*c*) and a blocking wall (e.g., BW2). The substrate 202 includes a first fin (e.g., 203*b*) and a second fin (e.g., 203*c*) separated by an insulating region 222. The first stack of semiconductor nanosheets (e.g., 216) is disposed on the first fin (e.g., 203*b*). The second stack of semiconductor nanosheets (e.g., 216) disposed on the second fin (e.g., 203*c*). The gate structure 260 wraps the first and second stacks of semiconductor nanosheets (e.g., 216). The first strained layer (e.g., 240*b*) is disposed on the first fin (e.g., 203*b*) and abuts the first stack of semiconductor nanosheets (e.g., 216). The second strained layer (e.g., 240*c*) is disposed on the second fin (e.g., 203*c*) and abuts the second stack of semiconductor nanosheets (e.g., 216). The blocking wall (e.g., BW2) is disposed on the insulating region 222 and located between the first and second strained layers (e.g., 240*b* and 240*c*). The top surface BWt of the blocking wall (e.g., BW2) is higher than the top surface 240*t* of the first strained layer or the second strained layer (e.g., 240*b* or 240*c*).

In some embodiments, a bottom surface BWb of the first blocking wall (e.g., BW2) is higher than a top surface 240*t* of the first fin or the second fin (e.g., 203*b* or 203*c*).

In some embodiments, a first contact area (e.g., A2) between the first blocking wall and the first strained layer is different from a contact area (e.g., A3) between the first blocking wall and the second strained layer. In some embodiments, a first contact area (e.g., A2) between the first blocking wall and the first strained layer is substantially the same with a contact area (e.g., A3) between the first blocking wall and the second strained layer.

In some embodiments, the semiconductor device 200 further includes two first spacers 233 at opposite sides of the first strained layer (e.g., 240*b*), and two second spacers 233 at opposite sides of the second strained layer (e.g., 240*c*). In some embodiments, the first blocking wall (e.g., BW2) is in contact with one of the first and second spacers 233. In some embodiments, the first blocking wall (e.g., BW2) is separated from one of the first and second spacers 233.

In some embodiments, the semiconductor device 200 further includes an air gap AG between the first blocking wall (e.g., BW2) and one of the first and second spacers 233.

In some embodiments, the semiconductor device 200 further includes g a second blocking wall (e.g., BW1), wherein the first strained layer (e.g., 240*b*) is sandwiched by the first blocking wall (e.g., BW2) and the second blocking wall (e.g., BW1).

In some embodiments, the semiconductor device 200 further includes a liner layer 235 between the first fin (e.g., 203*b*) and the first strained layer (e.g., 240*b*) and between the second fin (e.g., 203*c*) and the second strained layer (e.g., 240*c*). In some embodiments, the liner layer 235 includes a polysilicon layer, a germanium (Ge) layer, a silicon-germanium (SiGe) layer, or a combination thereof.

In some embodiments, the semiconductor device 200 further includes a contact etch stop layer 242 disposed on the top surface of the first blocking wall, the top surface of the first strained layer and the top surface of the second strained layer.

In some embodiments of the disclosure, the liner layer is configured to line the bottom surfaces and the sidewalls of the strained layers. Such liner layer is beneficial for epitaxially growing the strained layers. In some embodiment, the blocking wall is provided between two adjacent strained layers at the same side to prevent the undesired merge or connection of strained layers. Accordingly, the blocking wall of the disclosure provides a benefit of epitaxial strained features with fewer merge defect and better device performance.

According to some embodiments, the semiconductor device includes a substrate, first and second stacks of semiconductor nanosheets, a gate structure, first and second strained layers and a blocking wall. The substrate includes first and second fins separated by an insulating region. The first stack of semiconductor nanosheets is disposed on the first fin. The second stack of semiconductor nanosheets disposed on the second fin. The gate structure wraps the first and second stacks of semiconductor nanosheets. The first strained layer is disposed on the first fin and abuts the first stack of semiconductor nanosheets. The second strained layer is disposed on the second fin and abuts the second stack of semiconductor nanosheets. The blocking wall is disposed on the insulating region and located between the first and second strained layers. The top surface of the blocking wall is higher than the top surface of the first strained layer or the second strained layer.

According to some embodiments, a method of forming a semiconductor device includes: forming a semiconductor stack on a substrate, wherein the semiconductor stack comprises first layers and second layers stacked alternately; patterning the semiconductor stack and the substrate to form semiconductor strips; forming insulating regions in lower portions of trenches between the semiconductor strips; forming a dummy gate stack across the insulating regions and the semiconductor strips; removing portions of each of the semiconductor strips at opposite sides of the dummy gate stack to form recesses exposing the substrate; forming blocking walls on the insulating regions, wherein one blocking wall is between two adjacent recesses; and epitaxially growing strained layers from the recesses, wherein portions of the strained layers are grown along sidewalls of the blocking walls.

According to some embodiments, a method of forming a semiconductor device includes: forming a first stack of semiconductor nanosheets on a first fin and forming a second stack of semiconductor nanosheets on a second fin, wherein each of the first stack of semiconductor nanosheets and the second stack of semiconductor nanosheets comprises Si nanosheets and SiGe nanosheets disposed alternately; forming first recesses in the first fin at opposite sides of the first stack of semiconductor nanosheets and forming second recesses in the second fin at opposite sides of the second stack of semiconductor nanosheets; laterally recessing the SiGe nanosheets to form cavities; forming inner spacers in the cavities respectively; forming a hard mask layer with an opening, wherein the opening is disposed between the first recesses and the second recesses; forming a blocking wall in the opening; removing the hard mask layer; forming first strained layers in the first recesses; and forming second strained layers in the second recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate comprising a first fin and a second fin separated by an insulating region;

a first stack of semiconductor nanosheets disposed on the first fin;

a second stack of semiconductor nanosheets disposed on the second fin;

a gate structure wrapping the first stack of semiconductor nanosheets and the second stack of semiconductor nanosheets;

a first strained layer disposed on the first fin and abutting the first stack of semiconductor nanosheets;

a first blocking wall disposed on the insulating region;

a second blocking wall disposed on the insulating region, wherein the first strained layer is sandwiched by the first blocking wall and the second blocking wall; and two first spacers at opposite sides of the first strained layer;

wherein one of the first spacers is horizontally separated from the first blocking wall by a gap, and another one of the first spacers is interfacing with the second blocking wall.

2. The semiconductor device of claim 1, wherein a bottom surface of the first blocking wall is higher than a top surface of the first fin or the second fin.

3. The semiconductor device of claim 1, further comprising a second strained layer disposed on the second fin and abutting the second stack of semiconductor nanosheets, wherein a contact area between the first blocking wall and the first strained layer is different from a contact area between the first blocking wall and the second strained layer.

4. The semiconductor device of claim 1, further comprising:

a second strained layer disposed on the second fin and abutting the second stack of semiconductor nanosheets; and two second spacers at opposite sides of the second strained layer.

5. The semiconductor device of claim 4, further comprising a gap between the first blocking wall and one of the second spacers.

6. The semiconductor device of claim 5, wherein at least one of the second spacers is connected to the first blocking wall.

7. The semiconductor device of claim 1, further comprising a liner layer between the first fin and the first strained layer.

8. The semiconductor device of claim 1, further comprising a contact etch stop layer disposed on the top surface of the first blocking wall, and the top surface of the first strained layer.

9. The semiconductor device of claim 1, wherein the first blocking wall has a multi-layer structure.

10. A semiconductor device, comprising:

a first stack of semiconductor nanosheets;

a second stack of semiconductor nanosheets;

a gate structure wrapping the first stack of semiconductor nanosheets and the second stack of semiconductor nanosheets;

a first strained layer abutting the first stack of semiconductor nanosheets;

a second strained layer abutting the second stack of semiconductor nanosheets;

a first blocking wall disposed on the insulating region and located between the first strained layer and the second strained layer;

a second blocking wall disposed on the insulating region, wherein the first strained layer is sandwiched by the first blocking wall and the second blocking wall; and two first spacers at opposite sides of the first strained layer, wherein one of the first spacers is horizontally separated from the first blocking wall by an unfilled gap, and another one of the first spacers is in physical contact with the second blocking wall.

11. The semiconductor device of claim 10, wherein a contact area between the first blocking wall and the first strained layer is different from a contact area between the first blocking wall and the second strained layer.

12. The semiconductor device of claim 10, wherein a contact area between the first blocking wall and the first strained layer is smaller than a contact area between the second blocking wall and the first strained layer.

13. The semiconductor device of claim 10, further comprising:

two second spacers at opposite sides of the second strained layer.

14. The semiconductor device of claim 13, further comprising an unfilled gap between the first blocking wall and one of the second spacers.

15. The semiconductor device of claim 10, further comprising a first fin under the first stack of semiconductor nanosheets and a second fin under the second stack of semiconductor nanosheets, wherein a bottom surface of the first blocking wall or the second blocking wall is higher than a top surface of the first fin or the second fin.

16. The semiconductor device of claim 10, wherein the first blocking wall has a multi-layer structure.

17. The semiconductor device of claim 10, wherein the second blocking wall has a multi-layer structure.

18. A semiconductor device, comprising:

a substrate;

a gate structure disposed over the substrate;

multiple strained layers disposed at opposite sides of the gate structure;

first and second blocking walls disposed at opposite sides of an adjacent strained layer; and two first spacers at opposite sides of the adjacent strained layer, wherein one of the first spacers is horizontally separated from the first blocking wall by a gap, and another one of the first spacers is interfacing with the second blocking wall.

19. The semiconductor device of claim 18, wherein each of the first and second blocking walls has a multi-layer structure.

20. The semiconductor device of claim 18, further comprising a contact etch stop layer covering the multiple strained layers and the first and second blocking walls, wherein the first blocking wall comprises a first blocking layer and a second blocking layer, and top surfaces of the first blocking layer and the second blocking layer respectively interface the contact etch stop layer.

* * * * *